(12) United States Patent
Granger-Jones et al.

(10) Patent No.: US 10,056,895 B2
(45) Date of Patent: Aug. 21, 2018

(54) HIGH POWER FET SWITCH

(75) Inventors: Marcus Granger-Jones, Scotts Valley, CA (US); Christian Rye Iversen, Vestbjerg (DK)

(73) Assignee: Qorvo US, Inc., Greensboro, NC (US)

( * ) Notice: Subject to any disclaimer, the term of this patent is extended or adjusted under 35 U.S.C. 154(b) by 719 days.

(21) Appl. No.: 13/095,410

(22) Filed: Apr. 27, 2011

(65) Prior Publication Data

US 2011/0260774 A1 Oct. 27, 2011

Related U.S. Application Data

(60) Provisional application No. 61/328,384, filed on Apr. 27, 2010.

(51) Int. Cl.
  *H03K 17/10* (2006.01)
  *H03K 17/687* (2006.01)
  *H03K 17/693* (2006.01)

(52) U.S. Cl.
  CPC .................. *H03K 17/102* (2013.01)

(58) Field of Classification Search
  CPC ............. H03K 17/687; H03K 17/6871; H03K 17/693; H03K 2217/0018
  USPC ......................................... 327/427, 530, 534
  See application file for complete search history.

(56) References Cited

U.S. PATENT DOCUMENTS

| | | | |
|---|---|---|---|
| 4,890,077 A | 12/1989 | Sun | |
| 5,617,055 A * | 4/1997 | Confalonieri et al. | 327/404 |
| 6,094,088 A * | 7/2000 | Yano | H03K 17/693 327/534 |
| 6,803,680 B2 * | 10/2004 | Brindle et al. | 307/115 |
| 7,026,858 B2 | 4/2006 | Tosaka | |
| 7,106,121 B2 | 9/2006 | Hidaka et al. | |
| 7,250,804 B2 | 7/2007 | Brindle | |
| 7,268,613 B2 * | 9/2007 | Cranford et al. | 327/537 |
| 7,679,417 B2 | 3/2010 | Vice | |
| 7,843,280 B2 * | 11/2010 | Ahn et al. | 333/103 |

(Continued)

OTHER PUBLICATIONS

Kelly, D. et al., "The state-of-the-art of silicon-on-sapphire CMOS RF switches," 2005 IEEE Compound Semiconductor Integrated Circuity Symposium, Oct. 30-Nov. 2, 2005, pp. 200-203, IEEE.

(Continued)

*Primary Examiner* — Lincoln Donovan
*Assistant Examiner* — Colleen O Toole
(74) *Attorney, Agent, or Firm* — Withrow & Terranova, P.L.L.C.

(57) ABSTRACT

Described are embodiments of stacked field effect transistor (FET) switch having a plurality of FET devices coupled in series to form an FET device stack. To prevent the FET device stack from being turned on during large signal conditions, a first decoupling path and a second decoupling path are provided for the first FET device and the last FET device in the FET device stack. Both decoupling paths are configured to pass a time-variant input signal during the open state. The first decoupling path may be coupled from the drain contact of the first FET device to the gate contact or the source contact. The second decoupling path may be coupled from the source contact of the last FET device to the gate contact or drain contact. The time-variant input signal bypasses the FET device stack through the first and second decoupling paths during the open state.

17 Claims, 9 Drawing Sheets

(56) References Cited

U.S. PATENT DOCUMENTS

| | | | |
|---|---|---|---|
| 7,848,712 B2* | 12/2010 | Fu | H03K 17/145 |
| | | | 333/100 |
| 8,044,739 B2 | 10/2011 | Rangarajan et al. | |
| 8,058,922 B2 | 11/2011 | Cassia | |
| 8,093,940 B2* | 1/2012 | Huang et al. | 327/430 |
| 8,330,519 B2 | 12/2012 | Lam et al. | |
| 8,779,840 B2* | 7/2014 | Sugiura | H03K 17/693 |
| | | | 327/365 |
| 2001/0040479 A1* | 11/2001 | Zhang | 327/427 |
| 2002/0043991 A1* | 4/2002 | Nishitoba | G09G 3/3233 |
| | | | 327/94 |
| 2007/0139094 A1 | 6/2007 | Nakatsuka et al. | |
| 2009/0212843 A1* | 8/2009 | Deboy | H01L 29/7803 |
| | | | 327/377 |
| 2010/0214009 A1 | 8/2010 | Fechner | |

OTHER PUBLICATIONS

Shifrin, M.B. et al., "Monolithic FET structures for high-power control component applications," IEEE Transactions on Microwave Theory and Techniques, Dec. 1989, pp. 2134-2141, vol. 37, No. 12, IEEE.

Tinella, C. et al., "0.13/spl mu/m CMOS SOI SP6T antenna switch for multi-standard handsets," 2006 Topical Meeting on Silicon Monolithic Integrated Circuits in RF Systems, Jan. 18-20, 2006, pp. 58-61, IEEE.

Sonnerat, F. et al., "4G Antenna Tuner Integrated in a 130 nm CMOS SOI Technology", 2012 IEEE 12th Topical Meeting on Silicon Monolithic Integrated Circuits in RF Systems (SiRF), Jan. 16-18, 2012, pp. 191-194.

Non-Final Office Action for U.S. Appl. No. 13/095,302, dated Oct. 19, 2012, 14 pages.

Final Office Action for U.S. Appl. No. 13/095,302, dated Feb. 19, 2013, 14 pages.

Non-Final Office Action for U.S. Appl. No. 13/095,302, dated Jun. 5, 2013, 13 pages.

Non-Final Office Action for U.S. Appl. No. 13/095,357, dated Aug. 6, 2012, 8 pages.

Final Office Action for U.S. Appl. No. 13/095,357, dated Jan. 2, 2013, 8 pages.

Advisory Action for U.S. Appl. No. 13/095,357, dated Mar. 8, 2013, 3 pages.

Notice of Allowance for U.S. Appl. No. 13/095,357, dated Apr. 5, 2013, 7 pages.

Supplemental Notice of Allowability for U.S. Appl. No. 13/095,357, dated Jun. 21, 2013, 4 pages.

Non-Final Office Action for U.S. Appl. No. 13/095,357, dated Aug. 7, 2013, 7 pages.

Final Office Action for U.S. Appl. No. 13/095,302, dated Nov. 19, 2013, 14 pages.

Final Office Action for U.S. Appl. No. 13/095,357, dated Jan. 7, 2014, 9 pages.

Examiner's Answer for U.S. Appl. No. 13/095,302, dated Oct. 15, 2014, 8 pages.

Notice of Allowance for U.S. Appl. No. 13/095,357, dated Oct. 23, 2014, 7 pages.

Final Office Action for U.S. Appl. No. 13/922,337, dated Nov. 4, 2014, 10 pages.

Advisory Action for U.S. Appl. No. 13/095,302, dated Feb. 27, 2014, 3 pages.

Non-Final Office Action for U.S. Appl. No. 13/922,337, dated Mar. 10, 2014, 11 pages.

Advisory Action for U.S. Appl. No. 13/095,357, dated Mar. 20, 2014, 2 pages.

Notice of Allowance for U.S. Appl. No. 13/922,337, dated Aug. 3, 2015, 7 pages.

Decision on Appeal for U.S. Appl. No. 13/095,302, dated Aug. 25, 2016, 7 pages.

\* cited by examiner

HIGH POWER FET SWITCH

RELATED APPLICATIONS

This application claims the benefit of provisional patent application Ser. No. 61/328,384 entitled "SINGLE SUPPLY GROUND, AC COUPLED STACKED HIGH POWER FET SWITCH, SINGLE SUPPLY AC COUPLED STACKED HIGH POWER FET SWITCH, AND SINGLE SUPPLY STACKED HIGH POWER FET SWITCH," filed Apr. 27, 2010, the disclosure of which is hereby incorporated herein by reference in its entirety. This application is related to U.S. Utility patent application Ser. No. 13/095,302, also entitled "HIGH POWER FET SWITCH," filed Apr. 27, 2011, now U.S. Pat. No. 9,673,802; and U.S. Utility patent application Ser. No. 13/095,357, also entitled "HIGH POWER FET SWITCH," filed Apr. 27, 2011, now U.S. Pat. No. 8,970,278, the disclosures of which are incorporated herein by reference in their entireties.

FIELD OF THE DISCLOSURE

This disclosure relates to field effect transistor (FET) switches and methods of operating the same. More particularly, the disclosure relates to stacked FET switches and methods of operating the same.

BACKGROUND

A prior art stacked field effect transistor (FET) switch 10 connected to an RF line 12 is depicted in FIG. 1. The stacked FET switch 10 has an FET device stack 14 that is formed by a plurality of FET devices 16 coupled in series. Each of the plurality of FET devices 16 includes a drain contact, D, a source contact, S, a gate contact, G, and a body contact, B. When the FET device stack 14 operates in a closed state, the FET device stack 14 presents a low impedance to the RF line 12. This provides a shunt path for a radio frequency (RF) signal 18 to ground. On the other hand, when the FET device stack operates in the open state, a high impedance is presented to the RF line 12 and thus, theoretically, the FET device stack 14 does not conduct any of the time-variant RF signal 18. Of course, in practice, some leakage currents are conducted through the FET device stack 14 during the open state, but generally are low enough so as to be negligible. By stacking the plurality of FET devices 16, the time-variant RF signal 18 can be distributed across the plurality of FET devices 16 of the FET device stack 14 allowing the FET device stack 14 to handle higher voltage RF signals 18.

To provide the appropriate biasing voltages for operating the FET device stack 14, the stacked FET switch 10 includes a prior art control circuit 20 having a DC voltage source 22, a negative voltage generator 24, a plurality of switches 26A, 26B, 26C, 26D, and 26E (referred to collectively as "switches 26"), and a bias control device 28 that controls the switches 26. The bias control device 22 controls the plurality of switches 26 to bias a gate voltage at gate contacts and a body voltage at the body contacts, B, in accordance with Table I below.

| Switch State | Gate Voltage | Body Voltage |
| --- | --- | --- |
| Open State | $-V_{bias}$ | $-V_{bias}$ |
| Transition State 1 | Ground | $-V_{bias}$ |
| Transition State 2 | Ground | Ground |
| Closed State | $+V_{bias}$ | Ground |

The drain and sources contacts, D, S, of the FET devices 16 are biased at ground or possibly at an RF port that provides a reference voltage during both the open state and the closed state. The voltage at the drain and sources contacts, D, S, does not change with respect the reference voltage. However, by biasing the gate contacts, G, at the voltage $-V_{bias}$, the channels of the FET devices 16 are pinched off and a buffer voltage is provided that ensures that the time-variant RF signal 18 does not turn on the plurality of FET devices 16 during the open state. To prevent reverse bias diodes from being formed between the body of each of the plurality of FET devices 16 and the drain and sources of each of the plurality of FET devices 16, the body contacts are also biased at the voltage $-V_{bias}$.

One of the problems with this approach is that it requires a negative voltage generator 24 to maintain the gate contacts, G, at the negative bias voltage $-V_{bias}$ relative to ground during the open state. The negative voltage generator 24 may be implemented using negative charge pumps that add additional complexity to the control circuit 20 and may generate spurs. Furthermore, an additional DC voltage source 22 is required to provide a positive bias, $+V_{bias}$, to the gate contacts, G, and operate the FET device stack 14 in a closed state, which also adds complexity to the control circuit 20. If the negative voltage generator 24 is implemented by the negative charge pumps, the finite output impedance of the negative charge pumps also causes problems during transitions from different states as connections to the gates and body are charged and discharged.

Another problem with the prior art design is that it requires a bias swing of $|2V_{bias}|$ to turn the FET device stack 14 from the open state to the closed state, and vice versa. During steady state operation, the bias voltage $-V_{bias}$ has been selected so that voltage from the time-variant RF signal 18 does not cause the voltage at the gate contacts to exceed the breakdown voltage, given the maximum and minimum voltage peaks of the time-variant RF signal 18. However, transition states are required so that the voltage between the gate contact, G, and the other drain and source contact, D, S, of the FET devices 16 do not exceed the voltage handling capabilities of the FET devices 16 from the open and closed states. Of course this adds additional complexity to the control circuit 20, as switches 26B-26E and/or logic level shifters, are required to provide the appropriate gate and body voltages during each of these states. These switches 26B-26E of control device 28 must be appropriately timed to avoid stressing the FET devices 16 during these transitions.

In addition, another disadvantage of the prior art design is that the body contacts, B, must also be negatively biased if the plurality of FET devices 16 are the type of FET devices that require body biasing. For example, in certain types of FET devices 16, internal reverse bias diodes are activated between the body contact, B, and the drain and source contracts, D, S during the open state that prevent the FET device stack 14 from operating appropriately. If the internal reverse bias diodes are activated and a bias voltage, $-V_{bias}$, is not provided at the body contacts, B during the open state, then the voltage drop from the drain contact, D, to the source contacts, S, of each of the plurality of FET devices 16 would be limited to the voltage of a reverse bias diode, around 0.6 Volts. Thus, the prior art design requires negatively biasing the body contacts, B, to $-V_{bias}$ so that the reverse biased diodes are not reverse biased (or at least are not significantly reverse biased) during the open state. Also, the body contacts, B, must be transitioned back to ground when the FET device stack 14 operates in the closed state. This requires the control circuit 20 to have switches 26C, 26D and for the bias control device 28 to time these switches 26C, 26D appropriately. Other prior art embodiments use floating body designs and may not include body contacts, B and use self-biasing. However, prior art floating body designs suffer from poor linearity.

Accordingly, there is a need to develop a stacked FET switch with a control circuit that does not require excessive bias swings and negative biasing voltages.

SUMMARY

Embodiments in the detailed description describe a stacked field effect transistor (FET) switch having a plurality of FET devices coupled in series to form an FET device stack. The FET device stack is configured to operate in an open state and in closed state. During the closed state, the plurality of FET devices is turned on and thus a time-variant input signal can be transmitted through the FET device stack. On the other hand, in the closed state, the plurality of FET devices is turned off and the time-variant input signal is blocked from being transmitted through the FET device stack.

Each FET device includes a gate contact, a drain contact, and a source contact. In one embodiment, the FET device stack includes a first FET device that has a drain contact at a first end of the FET device stack, a last FET device having a source contact at the second end of the FET device stack, and one or more middle FET devices coupled between the first FET device and the last FET device. To prevent the FET device stack from being turned on during large signal conditions, a first decoupling path and a second decoupling path are provided for the first FET device and last FET device, respectively.

The first decoupling path is configured to pass the time-variant input signal during the open state. Accordingly, the first decoupling path presents a low impedance to the time-variant input signal in comparison to the high impedance presented to the time-variant input signal during the open state by the FET device stack. The first decoupling path may be connected to the FET device stack such that the time-variant input signal bypasses the FET device stack from the drain contact of the first FET device to the gate contact of the first FET device during the open state. Consequently, the time-variant input signal either does not cause a voltage drop during the open state from the drain contact of the first FET device to the gate contact of the first FET device or the voltage drop is at least substantially reduced.

The second decoupling path is also configured to pass the time-variant input signal during the open state. Accordingly, the second decoupling path presents a low impedance to the time-variant input signal in comparison to the high impedance presented to the time-variant input signal during the open state by the FET device stack. In one embodiment, the second decoupling path may be connected to the FET device stack such that the time-variant input signal bypasses the FET device stack from the gate contact of the last FET device to the source contact of the last FET device during the open state. Consequently, the time-variant input signal either does not cause a voltage drop during the open state from the gate contact of the last FET device to the gate contact of the last FET device or the voltage drop is at least substantially reduced.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The described devices, systems, and methods include topologies that prevent and/or impede a stacked field effect transistor (FET) switch from being forced out of the open state during large signal conditions. Also, devices, systems, and methods are described that greatly reduce biasing swings caused when a stacked field effect transistor (FET) switch transitions from an open state to a closed state and vice versa. Furthermore, no negative voltage generator are needed to force the negative biasing of FET devices during the open state.

Figure 1:
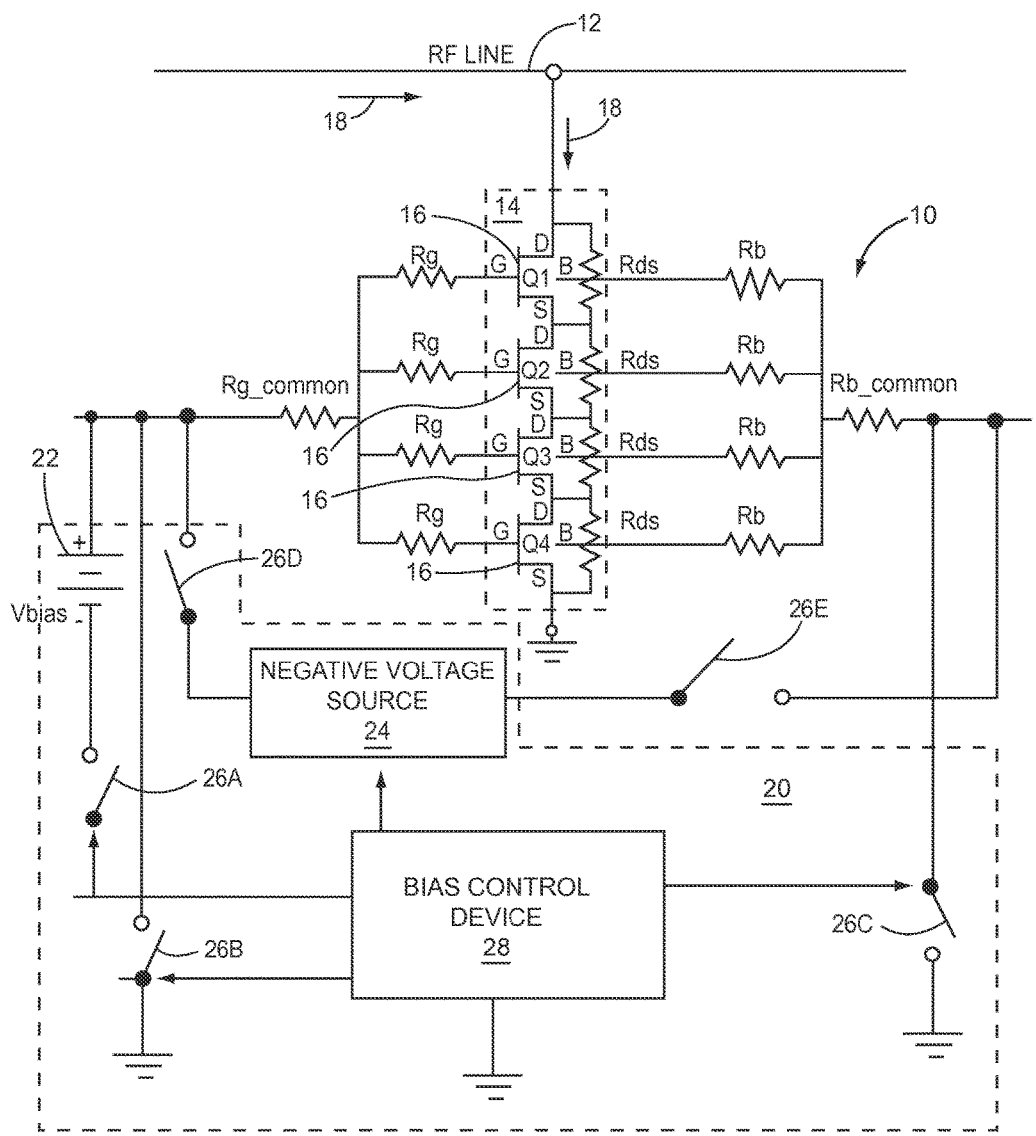
FIG. 1 illustrates a prior art stacked FET switch.
Figure 2:
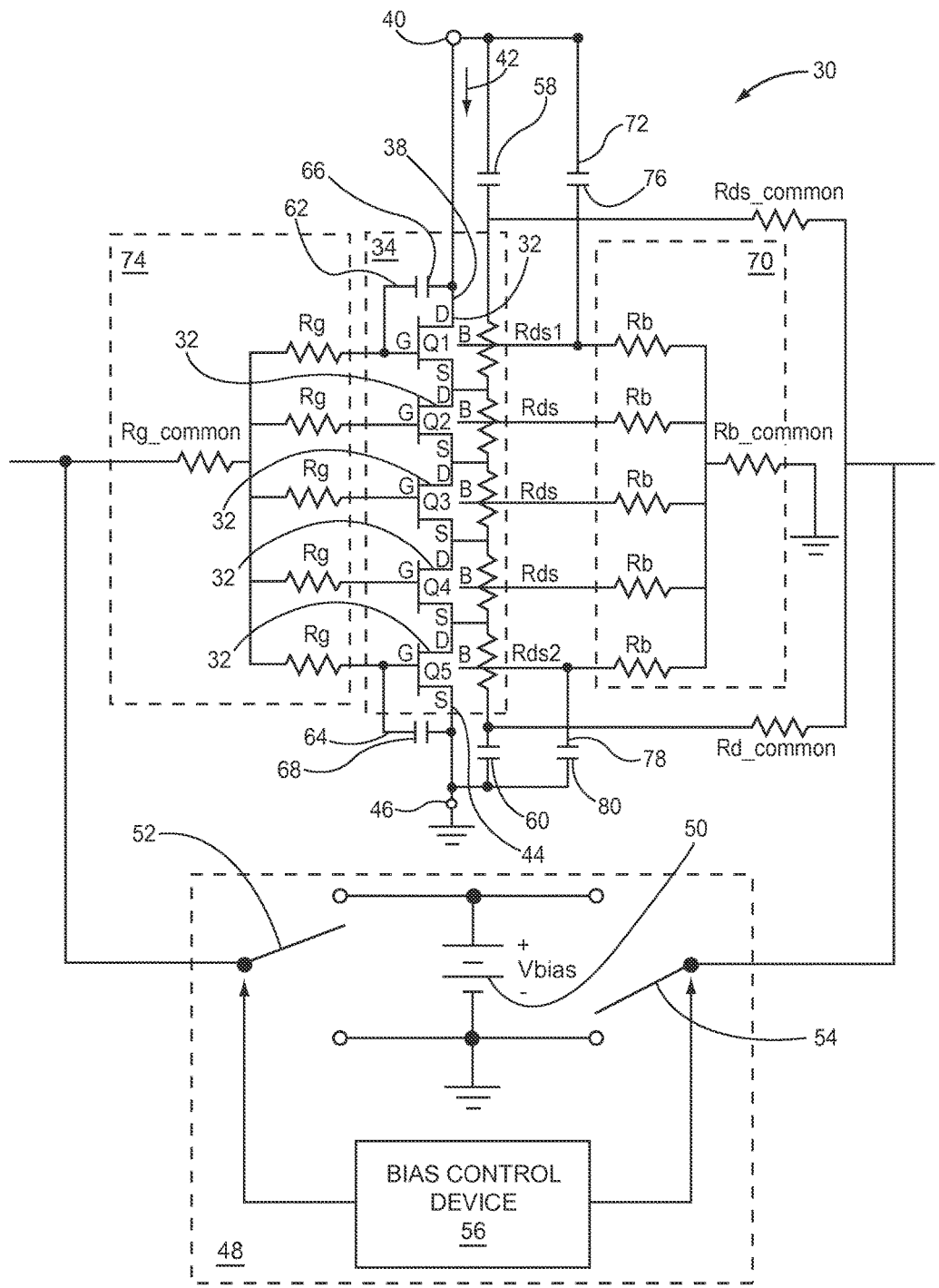
FIG. 2 illustrates one embodiment of a stacked FET switch in accordance with this disclosure.

FIG. 2 illustrates one embodiment of a stacked FET switch 30. The stacked FET switch 30 includes a plurality of FET devices (referred to generically as elements 32 and to a specific FET device as elements $Q_1$-$Q_5$) that are coupled in series to one another to form an FET device stack 34. In this embodiment, the FET device stack 34 has five (5) FET devices 32. However, as explained in further detail below, the FET device stack 34 may have any number of FET devices 32 greater than two (2). Each of the plurality of FET devices 32 has a source, a drain, and a gate. To electrically connect to the sources, drains, and gates, each of the plurality of FET devices 32 include source contacts, S, drain contacts, D, and gate contacts, G. In this example, each of the FET devices 32 also includes a body contact, B, to connect to a body of the FET device 32. However floating body embodiments that do not include a body contact, B, and have bodies that are self-biased can also be implemented in accordance with this disclosure.

The plurality of FET devices 32 are coupled in series to form a chain that has a first FET device ($Q_1$), a second FET device ($Q_2$), a third FET device ($Q_3$), a fourth FET device ($Q_4$), and a fifth and also last FET device ($Q_5$). The second FET device, ($Q_2$), the third FET device ($Q_3$), and the fourth FET device ($Q_4$) are middle FET devices ($Q_2$-$Q_4$) which are coupled between the first FET device ($Q_1$) and the last FET device ($Q_5$). In the illustrated FET device stack 34, the drain contact, D, of the first FET device ($Q_1$) is positioned at the first end 38 of the FET device stack 34 and is directly connected to an input terminal 40 for receiving a time-variant input signal 42, such as a radio frequency (RF) signal. At a second end 44 of the FET device stack 34, the last FET device ($Q_5$) has a source contact, S, that is directly connected to an output terminal 46 which connects to ground.

The FET device stack 34 may be formed, for example, on a silicon-on-insulator (SOI) type substrate, a silicon-on-sapphire (SOS) type substrate, a Galium Arsenide (GaAs) type substrate, or the like. Each of the plurality of FET devices 32 in the FET device stack may be a complementary metal-oxide-semiconductor (CMOS) type transistor, such as a metal-oxide-semiconductor field effect transistor (MOSFET). The FET devices 32 may also be metal semiconductor field effect transistors (MESFET), a high mobility field effect transistors (HFET), or the like. Utilizing SOI type substrates, SOS type substrates, and GaAs type substrates, may be advantageous in some applications because of the high degree of insulation provided by their internal layers. For example, in an SOI type substrate, the FET devices are formed on a device layer and an insulating layer (also known as a Buried Oxide layer "BOX") may be provided between a handle layer and the device layer. The insulating layer is typically made from an insulating or dielectric type oxide material such as $SiO_2$ while the handle layer is typically made from a semiconductor, such as silicon (Si). The degradation in bandwidth normally associated with the stacking of FET devices 32 and the increased parasitic capacitances of the extra components can be reduced utilizing SOI, SOS, or GaAs type substrates. Other techniques provided in this disclosure may also be utilized to suppress the loading effects of these parasitic capacitances. However, SOI type substrates, silicon-on-sapphire type substrates, and GaAs type substrates are not required and the particular substrate utilized to form the plurality of FET devices 32 should be determined in accordance with factors for associated with a particular desired application, such as, a required bandwidth response, distortion tolerances, cost, and the like. Also, the sources and drains between one of the plurality of FET devices 32 and another one of the plurality of FET devices 32 may be independent of one another or may be merged into a single drain/source having drain and source contacts, D, S for each FET device 32.

During an open state of the FET device stack 34, the plurality of FET devices 32 are off and the FET device stack 34 presents a high impedance between the first end 38 and the second end 44. Consequently, very little current, if any, is transmitted from the FET device stack 34 to the output terminal 46. On the other hand, in the closed state, the plurality of FET devices 32 have a low impedance and thus transmits the time-variant input signal 42 to the output terminal 46.

To switch the FET device stack 34 between the open state and the closed state, the stacked FET switch 30 has a control circuit 48 that is operably associated with the FET device stack 34. In this embodiment, the control circuit 48 has a DC voltage source 50, a first switch 52, a second switch 54, and a bias control device 56. The first switch 52 and the second switch 54 may be any type of suitable switch for providing the desired bias voltages. For example, the first switch 52 and second switch 54 may be transistor switches or inverters. The control circuit 48 is connected to each of the gate contacts, G, to the drain contact, D, of the second FET device ($Q_2$), through a resistor, $R_{ds1}$ and to the source contact of the fourth FET device ($Q_4$) through another resistor, $R_{ds2}$. Since resistor, $R_{ds1}$, is connected between the source contact, S, of the first FET device ($Q_1$), and the drain contact, D, of the second FET device ($Q_2$), one could also state that the control circuit 48 is connected to the source contact, S, of the first FET device, through the resistor, $R_{ds1}$. Similarly, one could also state that the control circuit 48 is connected, through resistor, $R_{ds2}$, to the drain contact, D, of the last FET device ($Q_5$). The middle FET devices ($Q_2$-$Q_4$) each have a resistor, $R_{ds}$, coupled between the drain contact, D, and the source contact, S. The resistors, $R_{ds1}$, $R_{ds}$, and $R_{ds2}$, may provide power dissipation, and impedance matching for the FET devices 32.

The stacked FET switch 30 may include a DC blocking device, such as a first capacitor 58 coupled between the top of the resistor, $R_{ds1}$, and the input terminal 40 and, another DC blocking device, such as a second capacitor 60, coupled between the bottom of resistor, $R_{ds2}$, and the output terminal 46. The first capacitor 58 and the second capacitor 60 hold the bias applied by the control circuit 48 so that the source contacts, S, and drain contacts, D, of the middle FET devices ($Q_2$-$Q_4$) are biased accordingly. The resistors, $R_{ds1}$, $R_{ds}$, and $R_{ds2}$, the first capacitor 58, and the second capacitor 60 are operably associated with one another so that the voltage stress of the time-variant input signal 42 across the FET device stack 34 is appropriately distributed during the open state and so that the appropriate drain and source contacts, D, S, are biased by the control circuit 48.

The control circuit 48 of FIG. 2 is connected to the FET device stack 34 to bias all of the drain contacts, D and the source contacts, S, of the middle FET devices ($Q_2$-$Q_4$). In this embodiment, the drain contact, D, of the second FET device ($Q_2$) is directly connected to the source contact, S, of the first FET device ($Q_1$) and thus biasing the drain contact, D and the source contact, S, of each of the middle FET devices ($Q_2$-$Q_4$) also biases the source contact, S, of the first FET device ($Q_1$). Similarly, the source contact, S, of the fourth FET device ($Q_4$) and the drain contact, D, of the last FET device ($Q_5$) are also directly connected and thus biasing the drain contact, D and the source contact, S, of each of the middle FET devices ($Q_2$-$Q_4$) also biases the drain contact, D, of the last FET device ($Q_5$). Consequently, the drain and source contacts S, D, between the drain contact, D, of the first FET device ($Q_1$) and the source contact, S, of the last FET device ($Q_5$) are biased by the control circuit 48. However, the drain contact, D, of the first FET device ($Q_1$) and the source contact, S, of the last FET device ($Q_5$) are not biased (or at least not significantly biased) by the control circuit 48. This is because the first capacitor 58 and the second capacitor 60 are configured to block the bias applied by the control circuit 48 and prevent the drain contact, D, and the source contact, S of the drain contact, D, of the first FET device ($Q_1$) and the source contact, S, of the last FET device ($Q_5$) from being biased.

In this embodiment, the control circuit 48 is connected to apply the bias to the drain contact, D, of the second FET device ($Q_2$), through a resistor, $R_{ds1}$, and to the source contact of the fourth FET device ($Q_4$) through another resistor, $R_{ds2}$. However, the control circuit 48 may be connected, either directly or indirectly, to any one, more than one, or all of the drain and/or source contacts, D, S, of the middle FET devices ($Q_2$-$Q_4$), to the source contact, S, of the first FET device ($Q_1$), or through the drain contact, D, of the last FET device ($Q_5$) to apply the bias and provide the appropriate bias voltages. In other words, the control circuit 48 may be connected to apply the bias, to the FET device stack 34, either directly or indirectly, so long as the applied bias is not blocked by the first capacitor, 58 and the second capacitor 60. Different connection topologies between the control circuit 48 and FET device stack 34 may be advantageous or disadvantageous for different reasons. Sensitivity to turn-on times may be considered when determining the particular circuit topology for connecting the control circuit 48 with the FET device stack 34. Also, loading effects may be considered for the particular application. For example, the paths that connect the control circuit 48 to the drain contact, D of the second FET device ($Q_2$) and the source contact, S, of the fourth FET device ($Q_4$) have resistors, $R_{ds\_common}$, which present a load to the first end 38 and second end 44 of the FET device stack 34, respectively. Resistors, $R_{ds\_common}$, may be advantageous to reduce distortion but may also cause leakage currents. Also, different types of filtering devices (not shown) and the like may connected between the control circuit 48 and the FET device stack 34 to prevent the time-variant input signal 42 from leaking into and damaging the control circuit 48. These and other circuit topologies for connecting the control circuit 48 to the FET device stack 34 would be apparent to one of ordinary skill in the art in light of this disclosure.

To place the FET device stack 34 in the closed state, the control circuit 48 biases the gate contacts, G, of each of the plurality of FET devices 32 at a first voltage, $+V_{bias}$, relative to a reference voltage. In this example, the reference voltage is ground. In alternative embodiments, the reference voltage may be at other voltage levels depending on the design requirements of the stacked FET switch 30 or the external nodes that are connected to the stacked FET switch 30. If the plurality of FET devices 32 are depletion mode type FET devices 32, the plurality of FET devices 32 have a reverse biased pinch-off voltage ($-V_p$). Since the first voltage, $+V_{bias}$, is positive relative to the reference voltage (ground in this case) and has a magnitude greater than a reverse biased pinch-off voltage, ($-V_p$), the plurality of FET devices 32 are turned on by the first voltage, $+V_{bias}$. For a depletion-mode type FET device 32, the pinch-off voltage ($-V_p$) is the voltage at the gate contact, G, relative to a voltage of the source contact, S, at which a channel of the FET device 32 is pinched off. In other words, if a reverse bias greater than the pinch-off voltage, ($-V_p$), is applied between the gate contact, G, and the source contact, S, of the FET device 32, the FET device 32 is turned off and placed in the open state. On the other hand, the plurality of FET devices 32 may also be enhancement mode type FET devices 32. In this case, a forward-biased pinch-off voltage, ($+V_p$), (also known as a threshold voltage) is required to turn on the channel of the FET device 32. As a result, if a forward bias less than the pinch-off voltage, ($+V_p$), is applied between the gate contact, G, and the source contact, S, of the enhancement mode type FET device 32, the enhancement mode FET device 32 is turned off and placed in the open state. Accordingly, the FET devices 32 are placed in the closed state by the first voltage, $+V_{bias}$, because the first voltage is greater than the pinch-off voltage, ($+V_p$) or ($-V_p$) depending on the type of FET device 32.

In the illustrated embodiment of FIG. 2, the plurality of FET devices 32 are the same type of FET device 32 and have essentially the same characteristics. For example, the FET devices may all be considered to have relatively the same reverse biased pinch-off voltage, ($-V_p$). It should be noted that this is not required. In other embodiments, each or some of the plurality of FET devices 32 may be of different types that have different characteristics. In these alternative embodiments, the first voltage, $+V_{bias}$, should be selected accordingly to provide the appropriate voltage for the channels of each of the FET devices 32 and place FET device stack 34 in the closed state.

Referring again to FIG. 2, the control circuit 48 applies a second voltage to the drain contact, D of the first FET device ($Q_1$) and the source contact, S, of the fourth FET device ($Q_4$) during the closed state. The second voltage should be less than the first voltage but non-negative relative to the reference voltage. In this embodiment, the second voltage is the same as the reference voltage, which in this case is ground; however, in other embodiments, higher voltages having a voltage level between the reference voltage and the first voltage may be selected. By applying the second voltage at the drain contact, D of the second FET device ($Q_2$) and the source contact, S, of the fourth FET device ($Q_4$), each of drain contacts, D, and source contacts, S, from the source contact, S, of the first FET device ($Q_1$), through the drain contact, D, of the last FET device ($Q_5$) are also biased to ground. Accordingly, the gate contacts, G, of the plurality of FET devices 32 are biased at the first voltage, $+V_{bias}$, relative to each of the source contacts, S, of the first through fourth FET device ($Q_1$-$Q_4$). In addition, the source contact, S, of the last FET device ($Q_5$) may be connected to be constantly biased at the second voltage, in this case ground. As a result, the gate contacts, G, of each of the FET devices 32 are biased above the reverse biased pinch-off voltage, ($-V_p$), relative to the source contacts, S and the FET device stack 34 operates in the closed state. Accordingly, the time-variant input signal 42 is transmitted through the FET device stack 34.

The control circuit 48 is also operable to place the FET device stack 34 in the open state by biasing the gate contacts, G, of the plurality of FET devices 32 at the second voltage (in this case ground) relative to a reference voltage (in this case ground). Also, the control circuit 48 applies a bias to the drain contact, D, of the second FET device ($Q_2$) at the first end 38 and the source contact, S, of the fourth FET device ($Q_4$) at the second end 44 at the first voltage, $+V_{bias}$, during the open state. This in turn causes each of drain contacts, D, and source contacts, S, from the source contact, S, of the first FET device ($Q_1$), through the drain contact, D, of the last FET device ($Q_5$) to be positively biased at the first voltage, $+V_{bias}$, relative to the reference voltage. As discussed above, the second voltage of the illustrated embodiment is the same as reference voltage, which is ground, and thus the gate contacts, G, of each of the plurality of FET devices 32 are biased at zero (0) volts relative to ground. Notice that while each of the gate contacts, G, of the plurality of FET devices 32 are non-negatively biased relative to the reference voltage, the gate contacts, G, are negatively biased at $-V_{bias}$ relative to each of drain contacts, D, and source contacts, S, from the source contact, S, of the first FET device ($Q_1$), through the drain contact, D, of the last FET device ($Q_5$).

As discussed above, the first capacitor 58 and the second capacitor 60 are configured to block the bias applied by the control circuit 48 and thus, the drain contact, D of the first FET device ($Q_1$) and the source contact, S, of the last FET device ($Q_5$) are not biased (or at least not significantly biased) at the first voltage, $+V_{bias}$, during the open state by the control circuit 48. Thus, a first decoupling path 62 and a second decoupling path 64 are provided to maintain drain to gate contacts, D, G, of the first FET device ($Q_1$) and the gate to source contacts, D, S, of the last FET device ($Q_5$) deactivated during the open state of the FET device stack 34. The first decoupling path 62 and the second decoupling path 64 are configured to pass the time-variant input signal during the open state. In this embodiment, the first decoupling path 62 and the second decoupling path 64 have a first decoupling capacitor 66 and a second decoupling capacitor 68 respectively. The first decoupling capacitor 66 and the second decoupling capacitor 68 are configured to pass the time-variant input signal 42 by presenting a low impedance to the time-variant input signal 42 relative to the impedance of the first FET device ($Q_1$) and the last FET device ($Q_5$) during the open state.

In this manner, the time-variant input signal 42 does not present a (significant) voltage load between the drain contact, D, and the gate contact, G, of the first FET device ($Q_1$) and the gate contact, G, and the source contact, S, of the last FET device ($Q_5$). In the illustrated embodiment, the FET devices 32 have congruent drains and sources and thus the impedance characteristics between the drain contact, D, and the gate contact, G, and the source contact, S, and the gate contact, G, of each of the FET devices 32 are essentially the same. Thus, the voltage drop of the time-variant input signal 42 from the drain contact, D, to the gate contact, G, and from the gate contact, G, to the source contact, S, for each of the middle FET devices ($Q_2$-$Q_4$) is essentially the same when the FET device stack 34 reaches steady state conditions. Thus half of the voltage drop across each of the middle FET devices ($Q_2$-$Q_4$) occurs from the drain contact, D, to the gate contact, G, and the other half occurs from the gate contact, G, to the source contact, S during the open state. As explained in further detail below, the voltage drop of the time-variant input signal 42 from the gate contact, G, to the source contact, S, of the first FET device ($Q_1$) is the same as the voltage drop from the drain contact, D, to the gate contact, G, or the gate contact, G, to the source contact, S, of one of the middle FET devices ($Q_2$-$Q_4$) during the open state. Similarly, the voltage drop of the time-variant input signal 42 from the drain contact, D, to the source contact, S, of the last FET device ($Q_5$) is the same as the voltage drop from the drain contact, D, to the gate contact, G, or the gate contact, G, to the source contact, S, of one of the middle FET devices ($Q_2$-$Q_4$) during the open state. In other words, the voltage drop of the time-variant input signal 42 across each of the first FET device ($Q_1$) and the last FET device ($Q_5$) is half the voltage drop across one of the middle FET devices ($Q_2$-$Q_4$) during the open state.

The first decoupling path 62 is connected to the FET device stack 34 such that the time-variant input signal 42 bypasses the FET device stack 34 from the drain contact, D, of the first FET device ($Q_1$) to the gate contact, G, of the first FET device ($Q_1$) during the open state. In the illustrated embodiment, the first decoupling path 62 is connected directly between the drain contact, D, and the gate contact, G of the first FET device ($Q_1$). Similarly, the second decoupling path 64 is connected to the FET device stack 34 such that the time-variant input signal 42 bypasses the FET device stack 34 from the gate contact, G, to the source contact, S, of the last FET device ($Q_5$). In the illustrated embodiment, the second decoupling path 64 is connected directly between the gate contact and source contact, S, of the last FET device ($Q_5$). In this manner, the time-variant input signal 42 does not present a (significant) voltage load from the drain contact, D, to the gate contact, G, of the first FET device ($Q_1$) and from the gate contact, G, to the source contact, S, of the last FET device ($Q_5$).

By selecting the magnitude of, the first voltage, $+V_{bias}$, with respect to the pinch-off voltage, in this case, $(-V_p)$, the first voltage creates a buffer that prevents the time-variant input signal 42 from forcing the FET device stack 34 out of the open state. This is because the first voltage $+V_{bias}$, creates a buffer that prevents the activation of FET device stack 34 from the gate to source contact, G, S, of the first FET device ($Q_1$), through the drain contact, D, of the last FET device ($Q_5$). This buffer can be expressed as the bias voltage $+V_{bias}$ plus the pinch-off voltage, $(-V_p)$, as shown below:

$$V_{buffer} = +V_{bias+}(-V_p)$$

Since the time-variant input signal 42 must cause a voltage greater than $+V_{bias+}(-V_p)$, at the gate contacts, G, to turn on the middle FET devices ($Q_2$-$Q_4$) during the open state, the buffer of $V_{buffer} = +V_{bias+}(-V_p)$ prevents the FET device stack 34 from being forced out of the open state. The FET devices 32 may have congruent drains and sources that have similar activation and deactivation characteristics between the gate contact, G and the drain contact, D, and the gate contact, G, and the source contact, S. In this case, biasing the drain contact, D, of the FET devices 32 also provides a buffer of $+V_{bias+}(-V_p)$ that prevents the drain to gate of the FET devices 32 from being activated in the open state of the FET device stack 34. Accordingly, biasing the drain contact, D, of the last FET device ($Q_5$) and the source contact, S, of the first FET device ($Q_1$) also provides the same buffer of $+V_{bias+}(-V_p)$ that prevents the drain to gate of the last FET device ($Q_5$) and the gate to source of the first FET device ($Q_1$) from being activated in the open state of the FET device stack 34.

For depletion mode type FET devices 32, the buffer is less than the magnitude of the bias voltage $+V_{bias}$. However, for enhancement mode type FET devices 32, the buffer is greater than the magnitude of $+V_{bias}$, i.e. $V_{buffer} = +V_{bias+}(+V_p)$. Also note that, if in the alternative, the drains and sources of one or more of the FET devices 32 is not congruent then the buffer may be different between the gate contact, G, and the drain contact, D, and the source contact, S, and the gate contact, G, of the FET device 32.

The buffer, $V_{buffer}$, is provided by the control circuit 48 without requiring the use of a negative voltage source, such as a negative-charge pump. In addition, the bias swing from the open state to the closed state and vice versa at the gate contacts, G, of each of the plurality of FET devices is only the first voltage minus the second voltage. In this case, the first voltage is at $+V_{bias}$ and the second voltage is at ground and thus the bias swing created by the control circuit is only $|V_{bias}|$. Since the voltage swing is not greater than $|V_{bias}|$, transition states are not needed to prevent the voltage between the drain and gate contacts, D, G, of the FET devices 32 from exceeding the voltage handling capabilities of the FET devices 32 when transitioning to and from the open and closed states.

The FET device stack 34 is also prevented from being forced out of the open state by the first decoupling path 62 and the second decoupling path 64. The first decoupling path 62 is configured to pass the time-variant input signal 42 during the open state so the time-variant input signal 42 causes no or a small voltage drop from the drain contact, D, to the gate contact, G, of the first FET device ($Q_1$) during the open state. Similarly, the second decoupling path 64 is configured to pass the time-variant input signal 42 during the open state so that the time-variant input signal 42 causes no or a small voltage drop from the gate contact, G, to the source contact, S of last FET device ($Q_5$) during the open state. Utilizing the first decoupling path 62 and the second decoupling path 64 instead of simply biasing the drain contact, D, of the first FET device ($Q_1$) and source contact, S, of the last FET device ($Q_5$) may have certain advantages during large signal conditions when the time-variant input signal 42 may create very high voltages where the buffer, $V_{buffer}$ may be insufficient to prevent the activation of the middle FET devices ($Q_2$-$Q_4$), the first FET device ($Q_1$) from the gate contact, G, to source contacts, S, and the last FET device ($Q_5$). Since the first decoupling path 62 and the second decoupling path 64 bypass the time-variant input signal 42, no or a small voltage load is presented by the time-variant input signal 42 from the drain contact, D, to the gate contact, G, of the first FET device ($Q_1$) and from the gate contact, G, to the source contact, S, of the last FET device ($Q_5$). Thus, these remain off and any chain reaction caused by the activation of any of the other drain to gate or gate to sources may be stopped to maintain the FET device stack 34 in the open state. While the FET device stack 34 may lose half of the load handling capabilities of the first FET device ($Q_1$) due to the first decoupling path 62 and half of the load handling capabilities of last FET device ($Q_5$) due to the second decoupling path 64, the first decoupling path 62 and second decoupling path 64 prevent the FET device stack 34 from being forced out of the open state during large signal conditions.

Note that in the illustrated embodiment, the plurality of FET devices 32 have essentially the same characteristics and it was also assumed that the impedance characteristics between both the gate contacts, G, and the drain contact, D, and the gate contact, G and the source contacts, S, of each of the FET devices 32 are congruent at the frequencies of interest. However, this is not necessarily the case, and in other embodiments, each or some of the plurality of FET devices 32 may be of different types having different characteristics. In these alternative embodiments, the first voltage, $+V_{bias}$, should be selected accordingly to place FET device stack 34 in the open state and provide the appropriate buffer without causing excessive bias swings. Also, the FET device stack 34 should distribute the voltage of the time-variant input signal 42 across the FET device stack 34 in accordance with the impedance characteristics of the FET devices 32 to reduce the probability of damaging the FET devices 32. For example, in certain applications, the first FET device ($Q_1$) and the last FET device ($Q_5$) may be formed to be wider than the middle FET devices ($Q_2$-$Q_4$) to help reduce leakage currents, particularly under large signal operation.

To help ensure that the voltage drop of the time-variant input signal 42 is appropriately distributed across the FET device stack 34, a distribution network may be provided on the FET device stack 34. One example of such a distribution network is formed in FIG. 2, as the first capacitor 58, the second capacitor 60, and resistors, $R_{ds1}$, $R_{ds2}$, $R_{ds}$, and $R_{ds\_common}$. This distribution may be done in conjunction with the parasitic coupling afforded by the parasitic capacitances of the FET devices 32 between the gate to source, gate to drain, body to source, gate to body, and/or body to drain. These parasitic capacitances may occur at high frequencies above the high pass filter poles of the stacked FET switch 30.

The first capacitors 58 and second capacitor 60 operate as DC blocks and may provide a frequency response that helps evenly distribute the time-variant input signal 42. In alternative embodiments, other DC blocking devices may be utilized, such as active and passive filtering circuits, or the like. The first capacitor 58 and second capacitor 60 may also present relatively low impedance to the time-variant input signal 42 with respect to the impedance of the FET device stack 34 in the open state. Essentially, the first capacitor 58 and second capacitor 60 behave as high-pass filters by blocking the bias voltages from the control circuit 48 but provide a low impedance to the time-variant input signal 42 in the open state. Note that the bottom of the first capacitor 58 and the top of the resistor $R_{ds1}$ are connected to one another while the bottom of the resistor $R_{ds1}$ is connected to the source contact, S, of the first FET device ($Q_1$). As a result, the top of the resistor $R_{ds1}$, and the gate contact, G, of the first FET device ($Q_1$) are at the same voltage with respect to the time-variant input signal 42, while the biasing of the control circuit 48 is blocked with respect to the drain contact, D, of the first FET device ($Q_1$). The voltage drop between the gate contact, G, and the source contact, S, of the time-variant input signal 42 at the first FET device ($Q_1$) is thus about the same as the voltage drop across the resistor, $R_{ds1}$. In essence, the resistor $R_{ds1}$ and the drain to gate of the first FET device ($Q_1$) appear essentially in parallel to the time-variant input signal 42 during the open state and thus experience the same voltage drop with respect to the time-variant input signal 42. Similarly, the voltage drop from the gate contact, G, to the source contact, S, of the last FET device ($Q_5$) is about the same as the voltage drop across the resistor, $R_{ds2}$. In essence, the resistor $R_{ds2}$ and the drain to gate of the last FET device ($Q_5$) appear essentially in parallel to the time-variant input signal 42 during the open state and thus experience the same voltage drop with respect to the time-variant input signal 42. The voltage drop from the drain contact, D, to the source contact, S, of each of the middle FET devices ($Q_2$-$Q_4$) is about the same as the voltage drop across the resistors, $R_{ds}$.

As discussed above, each of the FET devices 32 of FIG. 2 may have congruent drains and sources and thus may have the same impedance characteristics from the gate contact, G, to the drain contact, D, and from the gate contact, G, to the source contact, S. Since the time-variant input signal 42 bypasses the FET device stack 34 from the drain contact, D, to the gate contact, G, of the first FET device ($Q_1$) and from the gate contact, G, to the source contact, S, of the last FET device ($Q_5$), the distribution network may be configured to evenly distribute the time-variant input signal 42 across the remaining gate to source contacts, G to S, and gate to drain contacts, G to D during the open state. Accordingly, the resistive value of $R_{ds1}$ and $R_{ds2}$ may be about half of the resistive value of the resistors, $R_{ds}$. The resistors, $R_{ds\_common}$, may also be utilized to prevent currents from leaking into the control circuit 48 for the FET device stack 34.

It should be noted however that this is simply one example of a distribution network for distributing the time-variant input signal 42 across the FET device stack 34. The distribution network may have any other suitable circuit topology for distributing the time-variant input signal 42 across the FET device stack 34. For instance, active components, such as transistors, may be utilized to replace one or more of the passive resistors, $R_{ds1}$ $R_{ds2}$, $R_{ds}$, $R_{ds\_common}$ and/or the first and second capacitors 58, 60. In addition, the relationship between the resistance values of the resistors $R_{ds1}$ $R_{ds2}$, $R_{ds}$, $R_{ds\_common}$ may vary in accordance to the particular impedance characteristics of each of the FET devices 32 or the voltage loading desired across any one of the stacked FET switch 30 for a particular application. For example. the resistance of resistors $R_{ds1}$, $R_{ds2}$, $R_{ds}$, $R_{ds\_common}$ may vary if one or more of FET devices 32 have dissimilar impedance characteristics to the other FET devices 32 or if one or more of the FET devices 32 do not have congruent drains and sources. Other circuit components in addition to resistors, $R_{ds}$, such as capacitors, may also couple across the drain contacts, D, and source contacts, S, to help ensure a more even distribution of the time-variant input signal 42 across the FET device stack 34. The capacitors may be implemented utilizing metal-insulator-metal (MIM) capacitors or parasitic capacitors if desired. In addition, variations in the voltage loading across the FET device stack 34 caused by practical considerations, such as leakage currents, may require circuit topologies to correct for non-ideal behavior.

Next, the plurality of FET devices 32 in the stacked FET switch 30 of FIG. 2 each have a body and a body contact, B, to bias the body of the FET device 32. The body contacts, B, of the plurality of FET devices 32 are biased to a bias voltage, in this case ground, whether the FET device stack 34 is in the open state or in the closed state. Biasing the body contact, B, of the plurality of FET devices 32 may be utilized to help define the voltages in the bodies of the plurality of FET devices 32 and reduce distortion. However, in the alternative, the plurality of FET devices 32 may not have body biasing. For example, alternative embodiments may have floating body designs even if the FET devices 32 are the type of FET devices 32 that require a negative bias between the transistor bodies and the drain and source contacts, D, S, to prevent the activation of reverse-body diodes when the FET device stack 34 is operating in the open state. While the body contacts, B, of the plurality of FET devices 32 in FIG. 2 may be biased to ground, the drain contacts, D, and source contacts, S, are biased to the first voltage, $+V_{bias}$, during the open state. Thus, the voltage bias seen between the body contacts, B, and the drain and source contacts, D, S, is a negative voltage, in this case $-V_{bias}$. Accordingly, a negative voltage is presented at the body contacts, B, relative to the drain and source contacts, D, S, without requiring a negative voltage source, such as a negative-charge pump. As a result, floating body topologies may be utilized even if the FET devices 32 are the type of FET devices 32 that require a negative bias to prevent the activation of reverse-body diodes.

The stacked FET switch 30 may also include a resistive circuit 70 coupled to body contacts, B, of the middle FET devices ($Q_2$-$Q_4$). The resistive circuit 70 includes a resistor, $R_{b\_common}$ and a resistor, $R_b$, coupled in series with each of the plurality of body contacts, B. The resistance presented by the resistive circuit 70 at the body contacts, B, may be high relative to the parasitic capacitances between the bodies of the FET devices ($Q_2$-$Q_4$) and the source and drain contacts, S, D at the frequency of interest. Other alternative circuit topologies provide the high resistance at the body terminals, B. For example and without limitation, all of the high resistance may be provided by a single resistor, such as, $R_{b\_common}$ or alternatively, $R_{b\_common}$ may not be provided at all. Active devices, such as transistors, may also be utilized. These and other circuit topologies for the resistive circuit would be apparent to one of ordinary skill in the art, as a result of this disclosure.

The stacked FET switch 30 in FIG. 2 also includes a third decoupling path 72 having a third decoupling capacitor 76 and a fourth decoupling path 78 having a fourth decoupling capacitor 80. The third decoupling path 72 is coupled between the input terminal 40 and the body contact, B, of the first FET device ($Q_1$) so that the time-variant input signal 42 bypasses the FET device stack 34 from the drain contact, D, of the first FET device ($Q_1$) to the body contact, B, of the first FET device ($Q_1$) during the open state. In this manner, the time-variant input signal 42 does not present a voltage load to the body contact, B, of the first FET device ($Q_1$) relative to the drain and source contacts, D, S. Similarly, the fourth decoupling path 78 is coupled between the output terminal 46 and the body contact, B, of the last FET device ($Q_5$) so that the time-variant input signal 42 bypasses the FET device stack 34 from the source contact, S, of the last FET device ($Q_5$) to the body contact, B, of the of the last FET device ($Q_5$). In this manner, the time-variant input signal 42 does not present a voltage load to the body contact, B, of the first FET device ($Q_1$) relative to the drain and source contacts, D, S. The third decoupling capacitor 76 and the fourth decoupling capacitor 80 are sized to present low impedance to the time-variant input signal 42 during the open state and are thus configured to pass the time-variant input signal 42. In this manner, the body contacts, B, of the first FET device ($Q_1$) and the last FET device ($Q_5$) are not loaded by the time-variant input signal 42 and reverse-biased diodes in the bodies of the first FET device ($Q_1$) and the last FET device ($Q_5$) are not turned on during the open state.

It should be noted that, if the FET devices 32 are CMOS type transistors built having a deep nwell, it may be desirable for the bias voltage at the body contacts, B, to be greater than the reference voltage to help avoid the activation of the reverse-diodes under large signal conditions. To do this, the body contacts, B, may be coupled to the positive terminal of the DC voltage source, 50, or to another internal or external voltage source, instead of ground. In other embodiments, the bodies of the FET devices 32 may be left floating and the deep nwell may be biased through a high value resistor to allow the deep nwell to self-bias under large signal conditions.

The stacked FET switch 30 shown by FIG. 2 includes a resistive circuit 74 that is coupled to the gate contacts, G, of the plurality of FET devices 32. In this embodiment, the resistive circuit 70 includes a common resistor, $R_{g\_common}$, and resistors, $R_g$, coupled in series to each one of the gate contacts, G. The resistive circuit 74 should present a high resistance at each of the gate contacts, G, relative to an impedance of the parasitic capacitances between the gates of the plurality of FET devices 32 and the drains and sources, such that the parasitic capacitances are rendered negligible at the frequency of interest. In this manner, the resistive circuit 74 does not load the FET device stack 34 and the FET device stack 34 has less distortion while preserving bandwidth. Other alternative circuit topologies may be utilized to provide the high resistance. For example and without limitation, all of the high resistance may be provided by a single resistor, such as, $R_{g\_common}$, or alternatively, $R_{g\_common}$, may not be provided at all. Active devices, such as transistors, may also be utilized. These and other circuit topologies for the resistive circuit 70 would be apparent to one of ordinary skill in the art, in light of this disclosure.

As mentioned above, the control circuit 48 of FIG. 2 is operably associated with the gate contacts, G of each of the FET devices 32, the drain contacts, D, and source contacts, S, of the middle FET devices ($Q_2$-$Q_4$), the source contact, S, of the first FET device ($Q_1$), and the drain contact, D, of the last FET device ($Q_5$) to provide the appropriate bias voltages relative to the reference voltage. The bias voltage at the gate contacts, G, is referred to as $V_G$ while the bias voltage at the drain contacts, D, and source contacts, S, of the middle FET devices ($Q_2$-$Q_4$), the source contact, S, of the first FET device ($Q_1$), and the drain contact, D, of the last FET device ($Q_5$) are referred to as $V_{stack}$. The bias voltages, $V_G$, $V_{stack}$ are presented in the Table II below.

| Switch State | $V_G$ | $V_{stack}$ |
|---|---|---|
| Open State | Second Voltage | First Voltage |
| Closed State | First Voltage | Second Voltage |

As mentioned above, the first voltage is positive relative to the reference voltage. The second voltage is non-negative relative to the reference voltage and lower than the first voltage. For the illustrated embodiment discussed above for FIG. 2, the specific bias voltages $V_G$, $V_{stack}$ are shown in the Table III below.

| Switch State | $V_G$ | $V_{stack}$ |
|---|---|---|
| Open State | Ground | +$V_{bias}$ |
| Closed State | +$V_{bias}$ | Ground |

The control circuit 48 of the stacked FET switch 30 may be configured in any manner to provide the above mentioned bias voltages, $V_G$, and $V_{stack}$ in Tables II, III. The control circuit 48 may include, without limitation, logic controllers, sequential controllers, feedback controllers, and/or linear controllers. These and other control topologies would be apparent to one of ordinary skill in the art, as a result of this disclosure. The control circuit 48 may also receive and transmit control signals and/or have internal programming and memory to determine when to switch the FET device stack 34 to and from the open and the closed states. In addition, while the DC voltage source 50 is included within the illustrated embodiment of the control circuit 48, in other embodiments, the control circuit 48 may simply connect to an external voltage source(s) to provide the appropriate bias voltage.

The stacked FET switch 30 described above for FIG. 2 does not require transition states when switching to and from the open state and the closed state, as shown by Tables II and III. Note, however, that this may not always be the case and alternative embodiments, fast-switch, high stress, or high voltage applications for the FET device stack 34 may require transition states to prevent excessive loading of the FET devices 32 or to ensure that the stacked FET switch 30 functions appropriately with external devices. Thus, the topology and control functions of the control circuit 48 may vary in accordance with the particular application for the stacked FET switch 30. Also, while the second voltage should be non-negative relative to the reference voltage, practical considerations and non-ideal circuit behavior may cause the second voltage to be slightly negative with respect to the reference voltage. Although the second voltage would still remain substantially non-negative relative to reference voltage (in this case ground), the second voltage may have a small negative difference between around (−0.1 V to −0.2V) relative to the reference voltage. In any case, the small negative difference needs to have a magnitude less than 10% of the magnitude of the first voltage relative to the reference voltage.

Next, the illustrated control circuit 48 includes the DC voltage source 50, the first switch 52, the second switch 54, and the bias control device 56. The positive terminal of the DC voltage source 50 provides the first voltage, +$V_{bias}$, and the grounded terminal provides the second voltage at ground. Connected to the positive terminal and the negative terminal of the DC voltage source 50 are the first and second switches 52, 54, which are operated by the bias control device 56. The first switch 52 connects to the gate contacts, G, of the plurality of FET devices 32 to provide the bias voltage, $V_G$ at the gate contacts, G. The second switch 54 is connected to the drain contact, D, of the first FET device ($Q_1$) and the source contact, S, of the fourth FET device ($Q_4$) to apply the bias voltage, $V_{stack}$. The bias control device 56 controls the first and second switches 52, 54, in accordance with Table III above to switch the FET device stack 34 into and out of the open and closed states.

The first and second capacitors 58, 60 maintain the first end 38 and the second end 44 of the FET device stack 34 appropriately biased in accordance with Table III during the open and closed states. The first capacitor 58 is connected between the source contact, S, of the first FET device ($Q_1$) and the input terminal 40. The second capacitor 60 is connected between the drain contact, D, of the last FET device ($Q_5$) and the output terminal 46. The stacked FET switch 30 may be useful in building shunt and series coupled RF switches, as the first end 38 and the second end 44 of the FET device stack 34 that can be connected directly to the input terminal 40 and output terminal 46, respectively. Other embodiments may include capacitors (not shown) coupled in series between the first end 38 and the input terminal 40 and/or the second end 44 and the output terminal 46 and have application in building programmable capacitor arrays, also known as digitally tunable capacitors. Note that while the embodiment in FIG. 2 has the output terminal 46 coupled to ground. Consequently, the stacked FET switch 30 may be utilized as a shunt switch for an RF line. However, in the alternative, the FET device stack 34 may be coupled in series in an RF line so that the output terminal 46 is an RF port.

Figure 3:
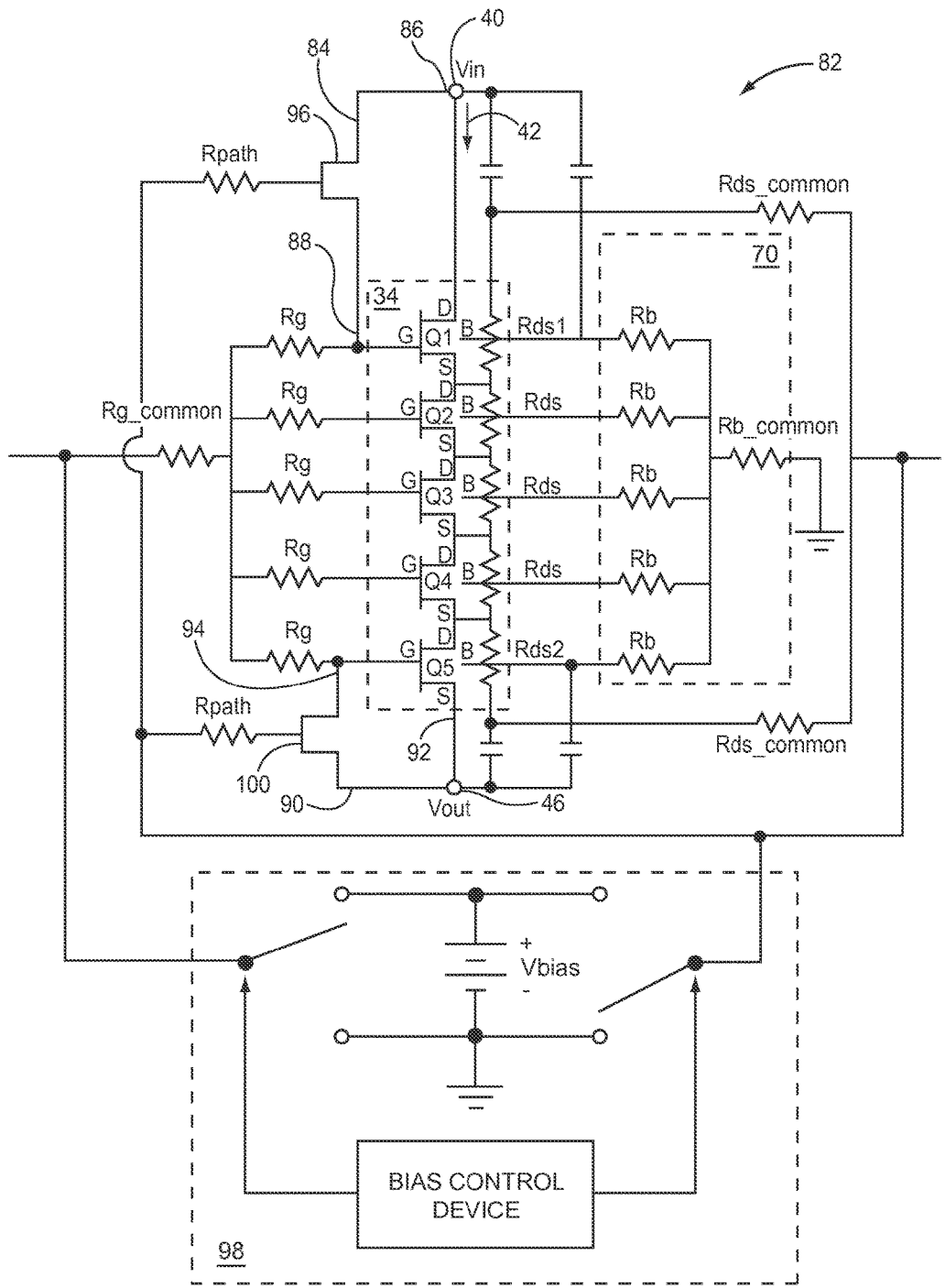
FIG. 3 illustrates another embodiment of a stacked FET switch in accordance with this disclosure.

FIG. 3 illustrates another embodiment of a stacked FET switch 82. The stacked FET switch 82 is similar to the stacked FET switch 30 described above, in FIG. 2. However, a first decoupling path 84 is coupled to the FET device stack 34 such that the time-variant input signal 42 bypasses the FET device stack 34 during the open state from the drain contact, D, of the first FET device ($Q_1$) to the gate contact, G, of the first FET device ($Q_1$) by having a first end 86 connected directly to the input terminal 40 and a second end 88 connected directly to the gate contact, G, of the first FET device ($Q_1$). Similarly, a second decoupling path 90 is coupled to the FET device stack 34 such that the time-variant input signal 42 bypasses the FET device stack 34 during the open state from the gate contact, G, of the last FET device ($Q_5$) to the source contact, S, of the last FET device ($Q_5$) by having a first end 92 connected directly to the output terminal 46 and a second end 94 connected directly to the gate contact, G, of the of the last FET device ($Q_5$). Also, the first decoupling path 84 is configured to pass the time-variant input signal 42 during the open state with a first decoupling transistor 96 which is operably associated and controlled by the control circuit 98. The second decoupling path 90 is also configured to pass the time-variant input signal 42 during the open state with a second decoupling transistor 100 which is operably associated and controlled by the control circuit 98. The first decoupling transistor 96 and the second decoupling transistor 100 may be FET devices, as illustrated in FIG. 3, or, in the alternative, any other suitable type of transistor. Resistors, $R_{path}$, may be provided to provide a high resistance so that the decoupling transistors 96, 100 do not load the FET device stack 34.

In the stacked FET switch 82 of FIG. 3, the control circuit 98 is connected to the gate contacts, G, of the first decoupling transistor 96 and the second decoupling transistor 100 so that they are biased in accordance with $V_{stack}$ from Table II above. Thus, the first decoupling path 84 is configured to pass the time-variant input signal 42 by having the first decoupling transistor 96 being turned on during the open state of the FET device stack 34. In this manner, a low impedance relative to the impedance of the first FET device ($Q_1$) is presented to the time-variant input signal 42 during the open state and no or a small voltage drop is experienced between the drain contact, D, of the first FET device ($Q_1$) and gate contact, G, of the first FET device ($Q_1$) for the time-variant input signal 42. On the other hand, the first decoupling transistor 96 is turned off during the closed state of the FET device stack 34 so that the time-variant input signal 42 is transmitted through the FET device stack 34. Similarly, the second decoupling path 90 is also configured to pass the time-variant input signal 42 by being turned on during the open state of the FET device stack 34 in accordance with $V_{stack}$ from Table II above. In this manner, a low impedance relative to the impedance of the last FET device ($Q_5$) is presented to the time-variant input signal 42 during the open state and no or a small voltage drop is experienced between the gate contact, G, of the last FET device ($Q_5$) and the source contact, S, of the last FET device ($Q_5$). On the other hand, second decoupling transistor 100 is turned off during the closed state of the FET device stack 34 and the time-variant input signal 42 is transmitted through the FET device stack 34.

Note that the input terminal 40 and the output terminal 46 in the stacked FET switch 82 may be RF ports having RF voltages, $V_{in}$ and $V_{out}$. In this case, the FET device stack 34 may be coupled in series within an RF line. Thus, the reference voltage would be the network voltage, $V_{out}$, of the RF line at the output terminal 46. Also, while the second voltage should be non-negative relative to the reference voltage, practical considerations and non-ideal circuit behavior may cause the second voltage to be slightly negative with respect to the reference voltage. Although the second voltage would still remain substantially non-negative relative to reference voltage (in this case $V_{out}$), the second voltage may have a small negative difference between around (−0.1 V to −0.2V) relative to the reference voltage.

In this embodiment, the reference voltage for measuring the first and second voltage of Table II above is at $V_{out}$ while the second voltage remains at ground. The second voltage should be higher than the reference voltage, $V_{out}$, and non-negative relative to the reference voltage, $V_{out}$. Thus, $V_{out}$ may be a negative voltage with respect to ground, since ground can be higher and non-negative with respect to the reference voltage, $V_{out}$. Since the reference voltage of this embodiment is at a negative voltage, $V_{out}$, in alternative embodiments, the second voltage may actually be selected to be negative with respect to ground so long as it is higher than or equal to the reference voltage, $V_{out}$. In this manner, the second voltage is non-negative relative to the reference voltage, $V_{out}$, though negative relative to the ground.

Figure 4:
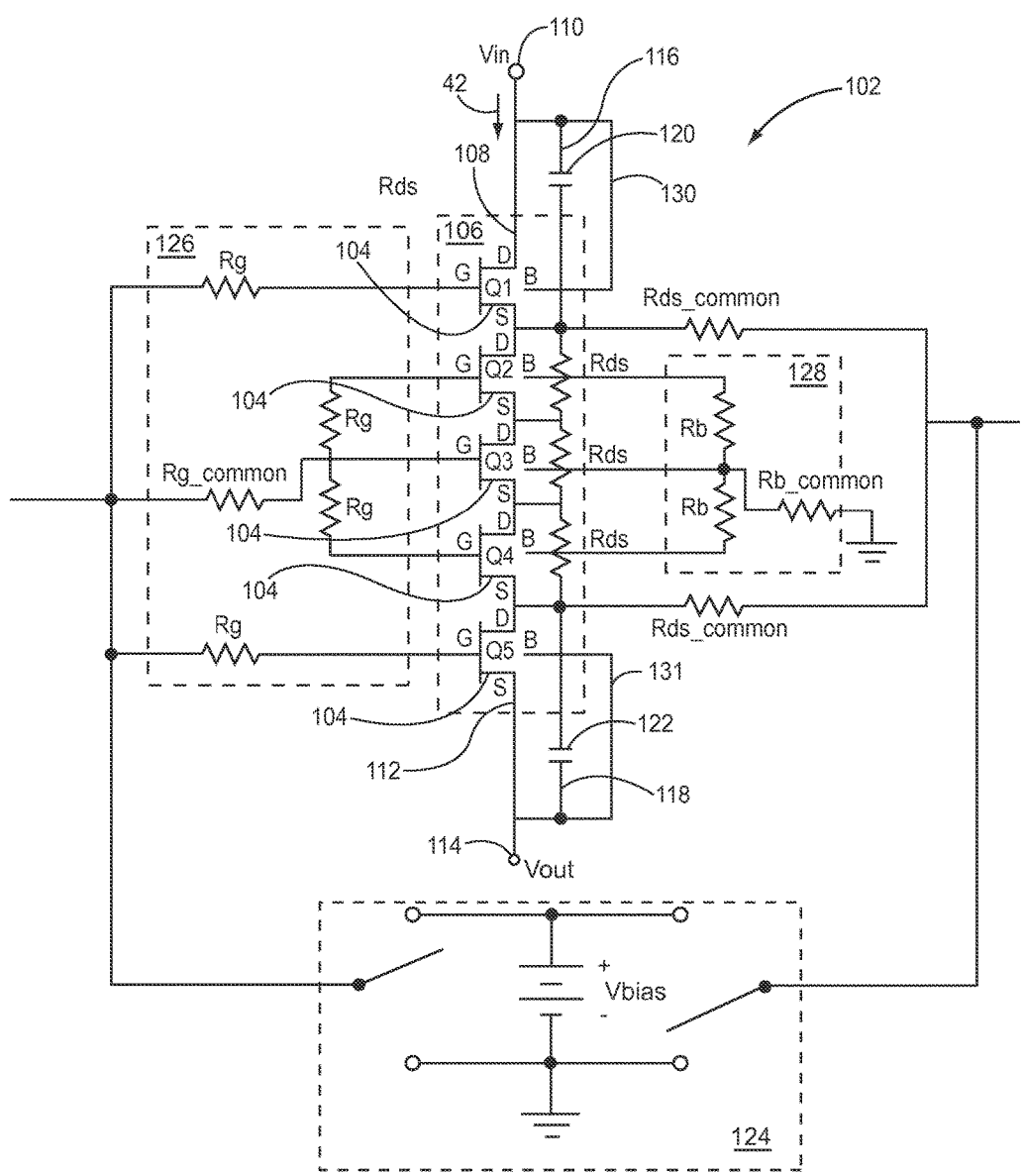
FIG. 4 illustrates yet another embodiment of a stacked FET switch in accordance with this disclosure.

FIG. 4 illustrates another embodiment of a stacked FET switch 102. As in the previous embodiments, the stacked FET switch 102 includes a plurality of FET devices (referred to generically as elements 104 and to a specific FET device as elements $Q_1$-$Q_5$) that are coupled in series to one another to form an FET device stack 106. Also, as in the previous embodiments, the FET device stack 106 has five (5) FET devices 104. Each of the plurality of FET devices 104 has a source, a drain, a gate, and a body. To electrically connect to the sources, drains, gates, and bodies, each of the plurality of FET devices 104 include source contacts, S, drain contacts, D, gate contacts, G, and body contacts, B. The plurality of FET devices 104 are coupled in series to form a chain that has a first FET device ($Q_1$), a second FET device ($Q_2$), a third FET device ($Q_3$), a fourth FET device ($Q_4$), and a fifth and also last FET device ($Q_5$). The second FET device, ($Q_2$), the third FET device ($Q_3$), and the fourth FET device ($Q_4$) are middle FET devices ($Q_2$-$Q_4$) which are coupled between the first FET device ($Q_1$) and the last FET device ($Q_5$). In the illustrated FET device stack 106, the drain contact, D, of the first FET device ($Q_1$) is positioned at the first end 108 of the FET device stack 106 and is directly connected to an input terminal 110 for receiving the time-variant input signal 42. At a second end 112 of the FET device stack 106, the last FET device ($Q_5$) has a source contact, S, that is directly connected to an output terminal 114 which connects to ground.

In this embodiment, a first decoupling path 116 and a second decoupling path 118 are provided in a distribution network that also includes resistors, $R_{ds}$. The first decoupling path 116 and the second decoupling path 118 include a first decoupling capacitor 120 and a second decoupling capacitor 122, respectively. As in the embodiment discussed above in FIG. 2, the first decoupling capacitor 120 and the second decoupling capacitor 122 are configured to pass the time-variant input signal 42 during the open state of the FET device stack 106. In this embodiment, the first decoupling path 116 is coupled to the first end 108 of the FET device stack 106 and to the source contact, S, of the first FET device ($Q_1$). In this manner, the first decoupling path 116 is coupled to the FET device stack 106 such that the time-variant input signal 42 bypasses the FET device stack 106 from the drain contact, D, of the first FET device ($Q_1$) to the source contact, S, of the first FET device ($Q_1$) during the open state of the FET device stack 106. Thus, no or a small voltage drop is caused by the time-variant input signal 42 from the drain contact, D, of the first FET device ($Q_1$) to the source contact, S, of the first FET device ($Q_1$) during the open state. Similarly, the second decoupling path 118 is coupled to the second end 112 of the FET device stack 106 and to the drain contact, D, of the last FET device ($Q_5$). In this manner, the second decoupling path 118 is coupled to the FET device stack 106 such that the time-variant input signal 42 bypasses the FET device stack 106 from the drain contact, D, of the last FET device ($Q_5$) to the source contact, S, of the last FET device ($Q_5$) during the open state of the FET device stack 106. Thus, no or a small voltage drop is caused by the time-variant input signal 42 from the drain contact, D, of the last FET device ($Q_5$) to the source contact, S, of the last FET device ($Q_5$) during the open state.

A control circuit 124 is operably associated with each of the gate contact, G, of each of the FET devices 104 and to the drain contacts, D, and source contacts, S, of the middle FET devices ($Q_2$-$Q_4$), the source contact, S, of the first FET device ($Q_1$), and the drain contact, D, of the last FET device ($Q_5$). The control circuit 124, provides a bias voltage, $V_G$, to each of the gate contacts, G, and a bias voltage, $V_{stack}$, to the drain contacts, D, and source contacts, S of the middle FET devices ($Q_2$-$Q_4$), the source contact, S, of the first FET device ($Q_1$), and the drain contact, D, of the last FET device ($Q_5$), in accordance with Tables II and III, above. While the FET device stack 106 may lose the load handling capabilities of the first FET device ($Q_1$) due to the first decoupling path 116 and the load handling capabilities of the last FET device ($Q_5$) due to the second decoupling path 118, the first decoupling path 116 and second decoupling path 118 prevent the FET device stack 106 from being forced out of the open state during large signal conditions.

The stacked FET switch 102 also has a resistive circuit 126 coupled to each of the gate contacts G, of the FET devices 104 and a resistive circuit 128 coupled to the body contacts, B, of the middle FET devices ($Q_2$-$Q_4$). The resistive circuit 126 includes a resistor, $R_{g\_common}$, and resistors, $R_g$. The resistive circuit 126 presents a high resistance at the gate contacts, G, such that parasitic capacitances between the gate contacts, G, and the drain contact, D, and source contacts, S, of each of the FET devices 104 are rendered negligible. Similarly, the resistive circuit 128 has a resistor, $R_{b\_common}$ and resistors, $R_b$. The resistive circuit 128 presents a high resistance at the body contacts, B, such that parasitic capacitances between the body contact, B, and the drain contact, D, and source contact, S, of the middle FET devices ($Q_2$-$Q_4$) are rendered negligible.

In this embodiment, the resistors, $R_g$, are each coupled directly to the control circuit 124 for the first FET device ($Q_1$) and the last FET device ($Q_5$) and between the gate contacts, G, of one of the middle FET devices ($Q_2$-$Q_4$), and the gate contact, G, of another one of the middle FET devices ($Q_2$-$Q_4$). Similarly, each of the resistors, $R_b$, are coupled between the body contact, B, of one of the middle FET devices ($Q_2$-$Q_4$), and the body contact, B, of another one of the FET devices ($Q_2$-$Q_4$). The circuit topology for the stacked FET switch 102 may be desirable, if the stacked FET switch 102 is being utilized in series in an RF line of an RF circuit. One benefit of the illustrated topology of resistive circuits 126, 128 is that the open state loading of the resistors, $R_g$, and $R_b$, may be substantially reduced. As a result, the circuit topology of resistive circuits 126, 128 allows resistors $R_g$, and $R_b$ to be substantially reduced in size.

To decouple the body contacts, B, of the first FET device ($Q_1$) and the last FET device ($Q_5$), a third decoupling path 130 and a fourth decoupling path 131 are provided in the stacked FET switch 102. In this embodiment, the third decoupling path 130 decouples the body contact, B, of the first FET device ($Q_1$) by short-circuiting the body contact, B, to the first end 108 of the FET device stack 106. The fourth decoupling path 131 decouples the body contact, B, of the last FET device ($Q_5$) by short-circuiting the body contact, B, of the last FET device ($Q_5$) to the source contact, S. In this manner, the time-variant input signal 42 is prevented from loading the body contacts, B, of the first FET device ($Q_1$) and last FET device ($Q_5$).

Figure 5:
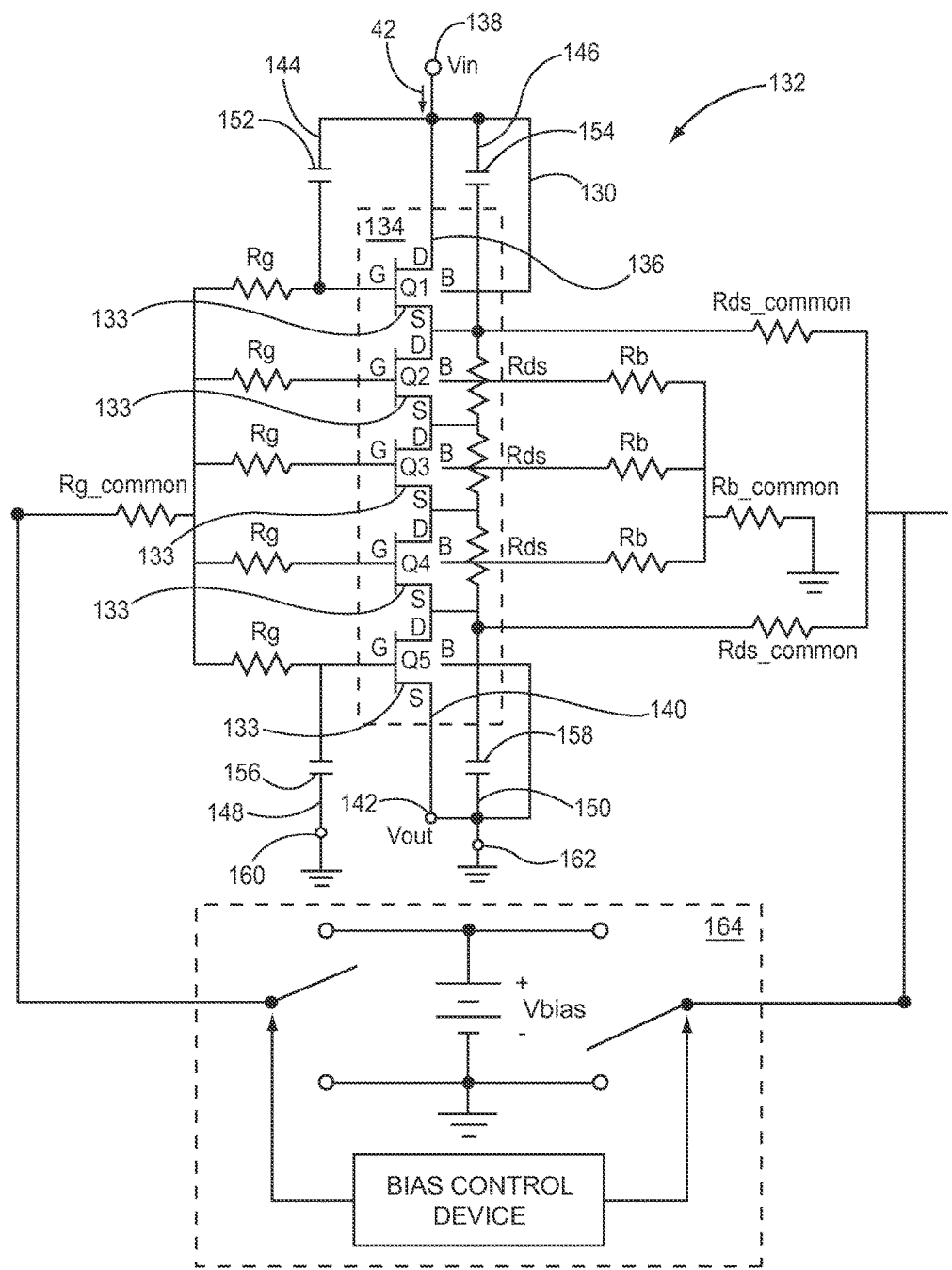
FIG. 5 illustrates still another embodiment of a stacked FET switch in accordance with this disclosure.

FIG. 5 illustrates yet another embodiment of a stacked FET switch 132. As in the previous embodiments, the stacked FET switch 132 includes a plurality of FET devices (referred to generically as elements 133 and to a specific FET device as elements $Q_1$-$Q_5$) that are coupled in series to one another to form an FET device stack 134. Also, as in the previous embodiments, the FET device stack 134 has five (5) FET devices 133. Each of the plurality of FET devices 133 has a source, a drain, a gate, and a body. To electrically connect to the sources, drains, gates, and bodies, each of the plurality of FET devices 133 include source contacts, S, drain contacts, D, gate contacts, G, and body contacts, B. The plurality of FET devices 133 are coupled in series to form a chain that has a first FET device ($Q_1$), a second FET device ($Q_2$), a third FET device ($Q_3$), a fourth FET device ($Q_4$), and a fifth and also last FET device ($Q_5$). The second FET device, ($Q_2$), the third FET device ($Q_3$), and the fourth FET device ($Q_4$) are middle FET devices ($Q_2$-$Q_4$) which are coupled between the first FET device ($Q_1$) and the last FET device ($Q_5$). In the illustrated FET device stack 134, the drain contact, D, of the first FET device ($Q_1$) is positioned at the first end 136 of the FET device stack 134 and is directly connected to an input terminal 138 for receiving the time-variant input signal 42. At a second end 140 of the FET device stack 134, the last FET device ($Q_5$) has a source contact, S, that is directly connected to an output terminal 142 which connects to ground.

The stacked FET switch 132 has a first decoupling path 144 and a second decoupling path 146 connected to the FET device stack 134 at the first FET device ($Q_1$). A third decoupling path 148 and a fourth decoupling path 150 are connected at the last FET device ($Q_5$). Each of the decoupling paths 144, 146, 148, 150 have a decoupling capacitor, 152, 154, 156, 158, respectively, configured to pass the time-variant input signal 42 when the FET device stack 134 is in the open state. The first decoupling path 144 is connected between the first end 136 of the FET device stack 134 and the gate contact, G, of the first FET device ($Q_1$), so that the time-variant input signal 42 bypasses the FET device stack 134 from the drain contact, D, of the first FET device ($Q_1$) to the gate contact, G, of the first FET device ($Q_1$) during the open state. The second decoupling path 146 is coupled from the first end 136 of the FET device stack 134 to the source contact, S, of the first FET device ($Q_1$) so that the time-variant input signal 42 bypasses the FET device stack 134 from the drain contact, D, of the first FET device ($Q_1$) to the source contact, S, of the first FET device ($Q_1$) during the open state. Accordingly, the second decoupling path 146 causes the time-variant input signal 42 to bypass the first FET device ($Q_1$) in the open state. The third decoupling path 148 is connected between a grounded terminal 160 and the gate contact, G, and the last FET device ($Q_5$), so that the time-variant input signal 42 bypasses the FET device stack 134 from the gate contact, G, of the last FET device ($Q_5$) to the source contact, S, of the last FET device ($Q_5$). The fourth decoupling path 150 is coupled from the drain contact, D, of the last FET device ($Q_5$) to a grounded terminal 162 so that the time-variant input signal 42 bypasses the FET device stack 134 from the drain contact, D, of last FET device ($Q_5$) to the source contact, S, of the last FET device ($Q_5$) during the open state. Accordingly, the fourth decoupling path 150 causes the time-variant input signal 42 to bypass the last FET device ($Q_5$) in the open state. During the open state, impact ionization can cause distortion when the While the second decoupling path 146 alone causes the time-variant input signal 42 to bypass the first FET device ($Q_1$) and the fourth decoupling path 150 alone causes the time-variant input signal 42 to bypass the last FET device ($Q_5$), providing both the first and second decoupling paths 144, 146, at the first FET device ($Q_1$) and the third and fourth decoupling paths 148, 150 at the last FET device ($Q_5$) may help reduce distortion in the internal drain-source junction of the first FET device ($Q_1$) and the last FET device ($Q_5$) during the open state of the FET device stack 134. Impact ionization across the drain-source junction can also cause distortion in the open state of the first FET device ($Q_1$) and the last FET device ($Q_5$) in certain applications and collapse the bias point of the internal drain-sources. In the illustrated embodiment of FIG. 5, a control circuit 164 operates the FET device stack 134 in accordance with Table III above, which biases the drain contact, D of the fifth FET device ($Q_5$) at the bias voltage +$V_{bias}$ during the open state of the FET device stack 134 while the source contact, S, of the fifth FET device ($Q_5$) is not biased due to the DC block of the decoupling capacitor 158. As a result, a voltage difference of around +$V_{bias}$ may be seen across the internal drain-source junctions of the fifth FET device ($Q_5$). In certain applications of the FET device stack 134, the voltage difference may be close to the drain-source voltage at which impact ionization occurs. Also, this voltage difference in combination with large signal conditions may cause impact ionization around the peaks of the time-variant input signal 42. In turn, the voltage difference may cause a leakage current to flow across the fifth FET device ($Q_5$) which in turn may cause a drop in the bias voltage, $+V_{bias}$, as seen by the first through fourth FET devices ($Q_1$-$Q_4$). This impact ionization problem can be suppressed by providing both the first and second decoupling paths 144,146 at the first FET device ($Q_1$) thereby reducing the voltage drop across the internal drain-source junction of the fifth FET device ($Q_5$).

In the illustrated embodiment of FIG. 5, a control circuit 164 operates the FET device stack 134 in accordance with Table III above. Thus, the drain contact, D of the first FET device ($Q_1$) is not biased at the bias voltage $+V_{bias}$ while the source contact, S, of the first FET device ($Q_1$) is biased at the bias voltage $+V_{bias}$. For the last FET device ($Q_5$), the drain contact, D of the last FET device ($Q_5$) is biased at the bias voltage $+V_{bias}$ while the source contact, S, of the last FET device ($Q_5$) is not biased at the bias voltage $+V_{bias}$. Thus, a voltage having a magnitude approximately around $|V_{bias}|$ may be seen across the internal drain-source junctions of the first FET device ($Q_1$) and the last FET device ($Q_5$). In certain applications of the FET device stack 134, the voltage $|V_{bias}|$ may be close to the drain-source voltage at which impact ionization occurs. During large signal conditions, impact ionization may occur around the peaks of the time-variant input signal 42, which results in distortion. Also, the voltage $|V_{bias}|$ may cause a leakage current to flow across the first FET device ($Q_1$) and the last FET device ($Q_5$) which in turn may cause a drop in the bias voltage, $+V_{bias}$, as seen by the middle FET device ($Q_2$-$Q_4$). This impact ionization problem can be suppressed by providing both the first and second decoupling paths at the first FET device ($Q_1$) and the third and fourth decoupling paths at the last FET device ($Q_5$) thereby reducing the voltage drop observed across the internal drain-source junction of each of the first FET device ($Q_1$) and the last FET device ($Q_5$).

Figure 6:
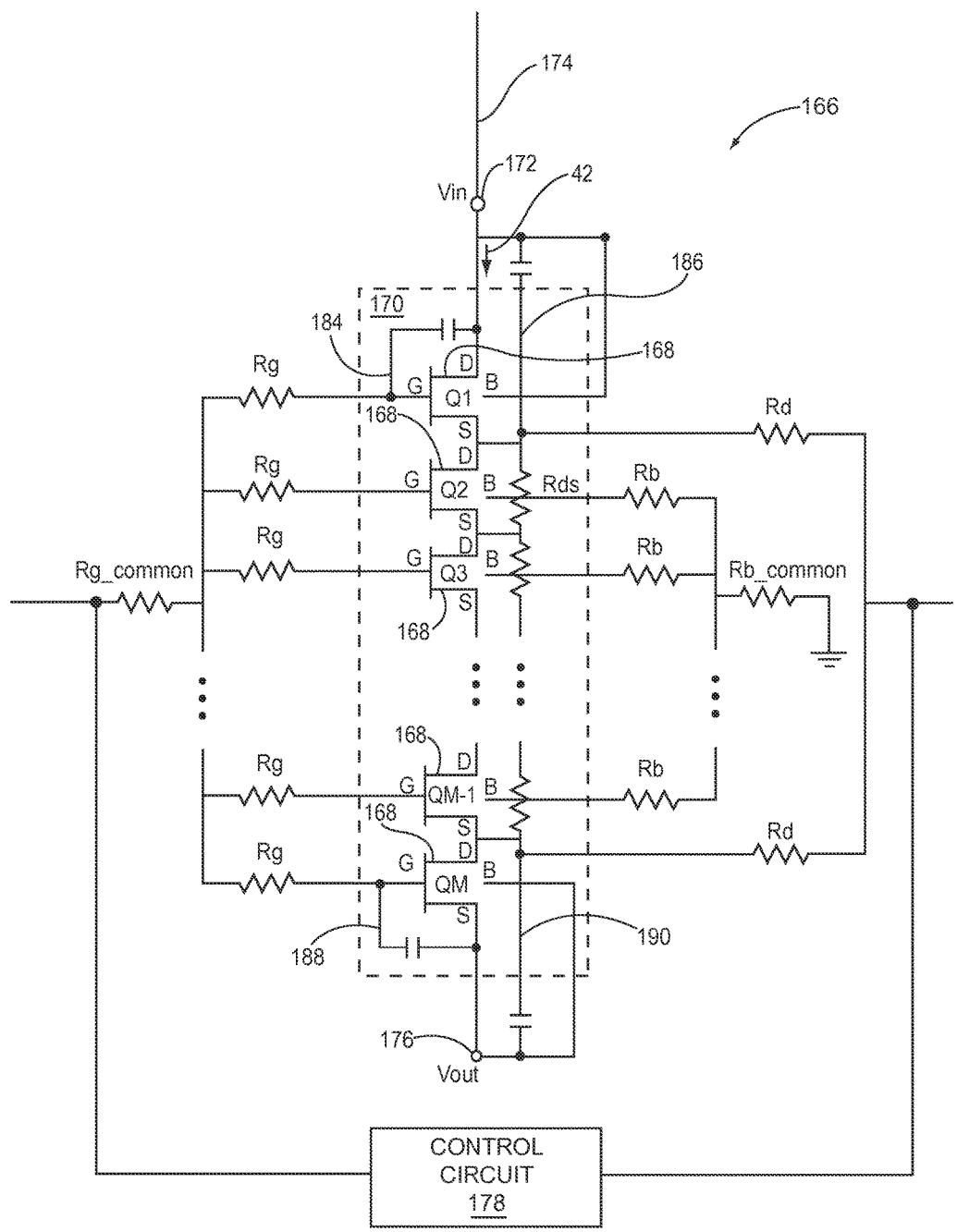
FIG. 6 illustrates still yet another embodiment of a stacked FET switch in accordance with this disclosure.

Referring now to FIG. 6, a stacked FET switch 166 may have any plurality of FET devices (referred to generically as elements 168 and to a specific FET device as elements $Q_1$-$Q_M$) coupled in series to form an FET device stack 170. Thus, the FET device stack 170 is stacked from a first FET device ($Q_1$) to a last FET device ($Q_M$) and middle FET device ($Q_2$-$Q_{M-1}$) are connected in the FET device stack 170 between the first FET device ($Q_1$) to a last FET device ($Q_M$). M is the number of FET devices 168 and may be any integer greater than 2. In the illustrated embodiment, the stacked FET switch 166 has an input terminal 172 connected in series in a signal line 174 that transmits the time-variant input signal 42, which may be an RF signal. During the closed state, the FET device stack 170 prevents the signal line 174 from transmitting the time-variant input signal 42 to the output terminal 176, which are at a reference voltage for the FET device stack 170, in this case $V_{out}$ which has been externally biased to ground. In the open state, the FET device stack 170 allows the time-variant input signal 42 to be transmitted to the output terminal 176. A control circuit 178 provides a first voltage and second voltage, in accordance with Table III, discussed above.

Figure 7:
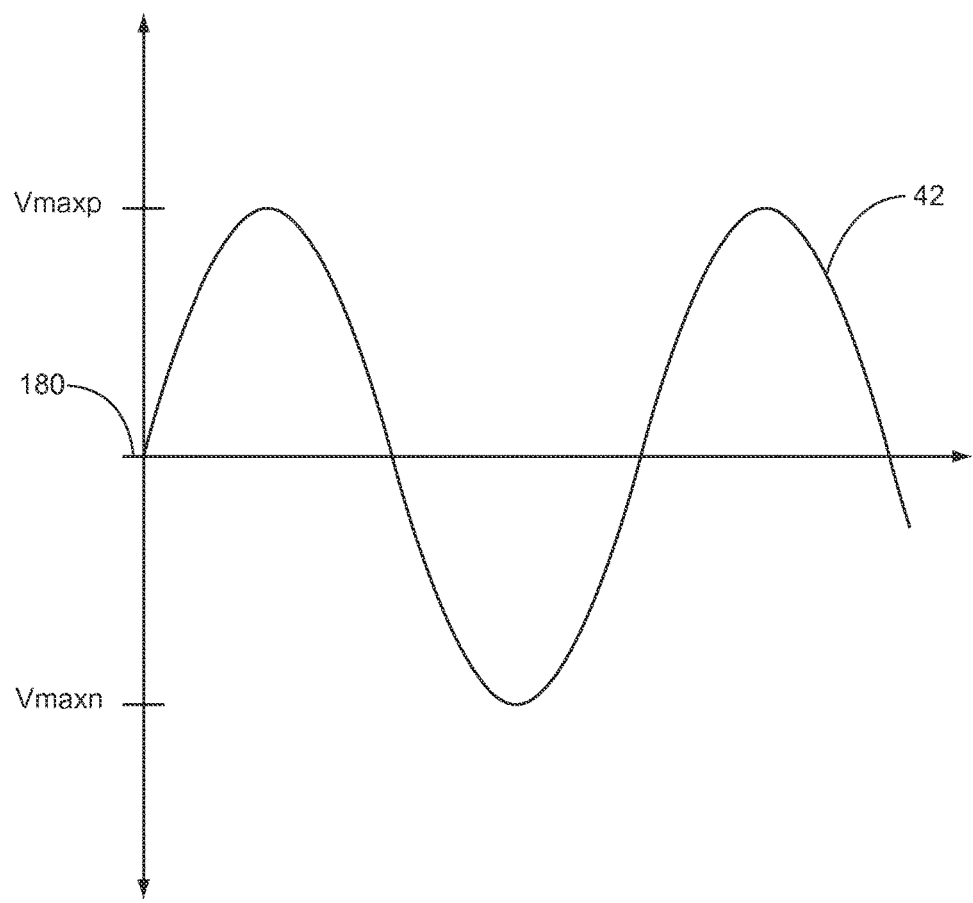
FIG. 7 illustrates one embodiment of a time-variant input signal for the stacked FET switch in FIG. 6.

Referring now to FIGS. 6 and 7, one type of time-variant input signal 42 is illustrated. The time-variant input signal 42 illustrated is a sinusoidal voltage having a maximum positive peak voltage, $V_{maxp}$, and a minimum negative peak voltage $V_{maxn}$, relative to a reference voltage, 180, in this case ground. The time-variant input signal 42 is illustrated as a simplified sinusoidal voltage to help discuss the operation of the stacked FET switch 166. Accordingly, the maximum positive peak voltage, $V_{maxp}$, and the minimum negative peak voltage $V_{maxn}$ have the same magnitude. Thus, the maximum peak voltage may be referred to as a maximum peak voltage, $V_{max}$. However, the time-variant input signal 42 may be any type of signal, such as, for example an RF signal, in which the time-variant input signal 42 would be more complex or even simpler than the signal shown in FIG. 8, may actually consist of a plurality of combined signals, and may not be symmetrical. For example, the maximum positive peak voltage, $V_{maxp}$, and the minimum negative peak voltage $V_{maxn}$ may have a different magnitude in the positive and negative cycles. Some time-variant input signals 42 may not have either a positive or a negative cycle and thus may be unicyclical and others may actually not be periodic at all. These and other considerations should be taken into account when determining maximum peak voltage, $V_{max}$ as would be apparent to one of ordinary skill in the art, in light of this disclosure.

The plurality of FET devices 168 in FIG. 6 may each be associated with a reverse biased pinch-off voltage, $(-V_p)$ and a breakdown voltage, $-V_{Break}$. The pinch-off voltage, $(-V_p)$, of an FET device 168 is the reverse bias voltage at the gate contact, G, relative to a voltage of the source contact, S, at which the FET device 168 (in this case a depletion mode FET device) is opened. In other words, if a reverse bias less than or equal to the pinch-off voltage, $(-V_p)$, is applied between the gate contact, G, and the source contact, S, of the FET device 168, a channel of the FET device 168 is pinched off and the FET device 168 is turned off. The breakdown voltage, $-V_{Break}$, is the voltage from the drain contact, D, to the gate contact, G at which the FET device 168 begins to conduct when in the open state. In other words, if a negative voltage greater than the breakdown voltage, $-V_{Break}$, is applied from the drain contact, D, to the gate contact, G, the FET device 168 breaks down and begins to conduct. In FIG. 6, the plurality of FET devices 168 all have essentially the same characteristics and thus are associated with the same pinch-off voltage, $-V_p$, and breakdown voltages, $-V_{Break}$. However, in other embodiments, the characteristics of the FET devices 168 may be different and thus each may be associated with a different pinch-off voltages and/or breakdown voltages. Also, in certain applications, the first FET device ($Q_1$) and the last FET device ($Q_M$) may be formed to be wider than the middle FET devices ($Q_2$-$Q_{M-1}$) to help suppress leakage currents caused by the voltage stress from the time-variant input signal 42 during the open state.

In another alternative embodiment, the FET device stack 168 may only be decoupled from the drain contact, D, to the gate contact, G, of the first FET device ($Q_1$) and/or only decoupled from the gate contact, G, to the source contact, S of the last FET device ($Q_M$). In this case, if the first FET device ($Q_1$) is only decoupled from the drain contact, D, to the gate contact, G, and/or the last FET device ($Q_M$), the voltage drop of the time-variant input signal 42 across the first FET device devices ($Q_1$) and/or the last FET device ($Q_5$) is about half of the voltage drop across each of the middle FET devices ($Q_2$-$Q_{M-1}$), if we assume that the FET devices 142 have congruent drains and sources. In the embodiment illustrated in FIG. 6, however, the first FET device ($Q_1$) is decoupled from the drain contact, D, to the source contact, S by the second decoupling path 146 and thus none or very little of the voltage of the time-variant input signal 42 is dropped across last FET device ($Q_M$).

Similarly, the last FET device ($Q_M$) is decoupled from the drain contact, D, to the source contact, S by the fourth decoupling path 150 and thus none or very little of the voltage of the time-variant input signal 42 is dropped across last FET device ($Q_M$).

The voltage drop of the time-variant input signal 42 may be distributed evenly across each of the drain to gate and gate to source junctions of the middle FET devices ($Q_2$-$Q_{M-1}$) during the open state. This helps to maximize the load handling capabilities of the FET device stack 168 assuming that the FET devices have congruent drains and sources that have similar impedance characteristics. Finally, in certain applications, the first FET device ($Q_1$) and/or the last FET device ($Q_5$) may be formed to be wider than the other FET devices ($Q_1$-$Q_{M-1}$) to help suppress leakage currents caused by the voltage stress from the time-variant input signal 42 during the open state.

Figure 8:
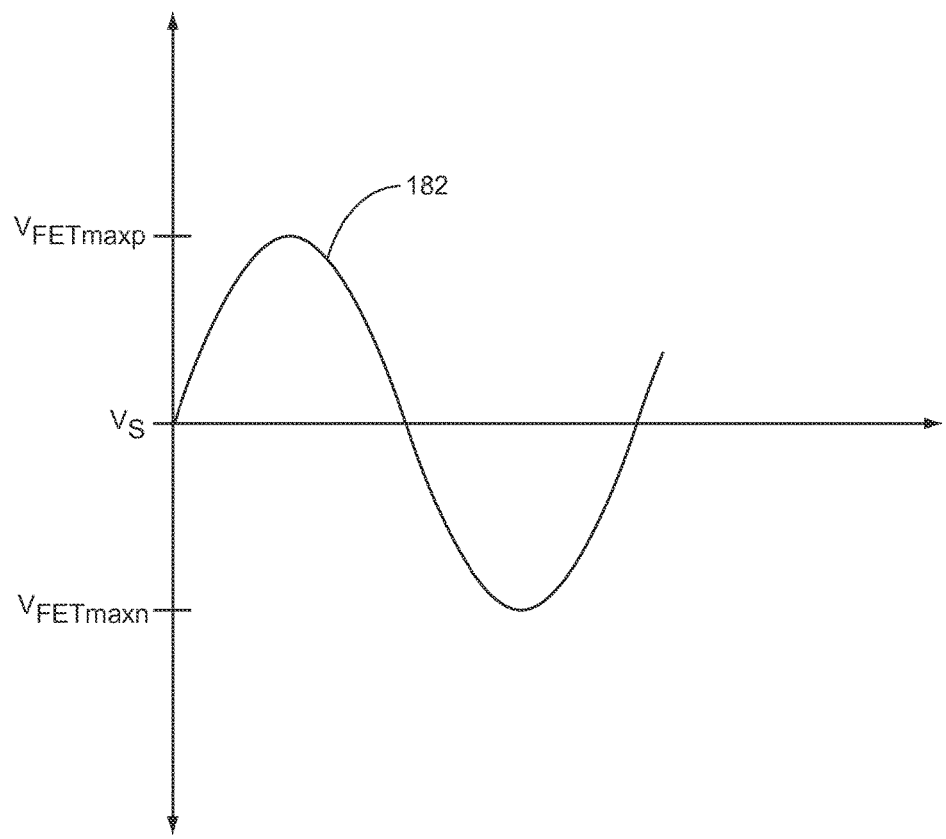
FIG. 8 illustrates a voltage at each of the drain contacts relative to the source contacts of the middle FET devices when an FET device stack in FIG. 6 is in an open state.

Referring now to FIGS. 6 and 8, FIG. 8 is a graph of a voltage signal 182 at the drain contacts, D of the middle FET devices ($Q_2$-$Q_{M-1}$) relative to their source contact, S, during the open state of the FET device stack 170. Note that the first FET device ($Q_1$) and the last FET device ($Q_M$) have been decoupled during the open state. A first decoupling path 184 and a second decoupling path 186 are configured to pass the time-variant input signal 42 during the open state and the time-variant input signal 42 bypasses the FET device stack 170 from the drain contact, D, of the first FET device ($Q_1$) to the source contact, S, of the first FET device ($Q_1$). Similarly, a third decoupling path 188 and a fourth decoupling path 190 are configured to pass the time-variant input signal 42 during the open state and the time-variant input signal bypasses the FET device stack 170 from the drain contact, D, of the last FET device ($Q_M$) to the source contact, S, of the last FET device ($Q_M$). Thus, the first FET device ($Q_1$) and the last FET device ($Q_M$) do not experience a voltage drop due to the time-variant input signal 42.

Note that the voltage signal in FIG. 8 is measured relative to the source contact, S, of the middle FET devices ($Q_2$-$Q_{M-1}$) and not to ground. The voltage signal 182 for each of the drain contacts, D, relative to ground, is clearly different for each of the middle FET devices ($Q_2$-$Q_{M-1}$). The middle FET devices ($Q_2$-$Q_{M-1}$) positioned higher in the stack would have a drain voltage with greater positive and negative voltage peaks relative to ground plus a biasing voltage, +$V_{bias}$. The drain voltage of the second FET device ($Q_2$) would be essentially the same as the time-variant input signal 42 (shown in FIG. 7) plus a biasing voltage, +$V_{bias}$, relative to ground, while the drain voltage of the second-to-last FET device ($Q_{M-1}$) would be essentially the same as the voltage signal 182 relative to ground plus the biasing voltage, +$V_{bias}$. However, since the time-variant input signal 42 may be evenly distributed across each of the middle FET devices ($Q_2$-$Q_{M-1}$), the drain voltages are relatively uniform relative to their source contact, S. Also, the biasing voltage, +$V_{bias}$, cancels out for voltage signal 182 since both of the drain contact, D, and the source contact, S, are biased by the biasing voltage, +$V_{bias}$ during the open state.

As illustrated, the voltage signal 182 has a maximum positive peak voltage, $V_{FETmaxp}$, and the minimum negative peak voltage $V_{FETmaxn}$. Since, in this case, the voltage signal is symmetrical, the magnitude of the maximum peak voltage, $|V_{FETmax}|$, can be represented as:

$$|V_{FETmax}| = \frac{V_{max}}{M-2}$$

The integer two (2) is subtracted from M because, as discussed above, in this embodiment, the first FET device ($Q_1$) and the last FET device ($Q_M$) have been decoupled from the stack with respect to the time-variant input signal 42 during the open state. However, if in the alternative, only the drain contact, D, to the gate contact, G, of the of the first FET device ($Q_1$) and the gate contact, G, to the source contact, S, of the last FET device ($Q_M$) are decoupled, then each of the first FET device ($Q_1$) and the last FET device ($Q_M$) may contribute half of their load handling capabilities to the FET device stack 170. Accordingly, in this case, the integer one (1) would be subtracted from M instead of the integer (2).

Figure 9:
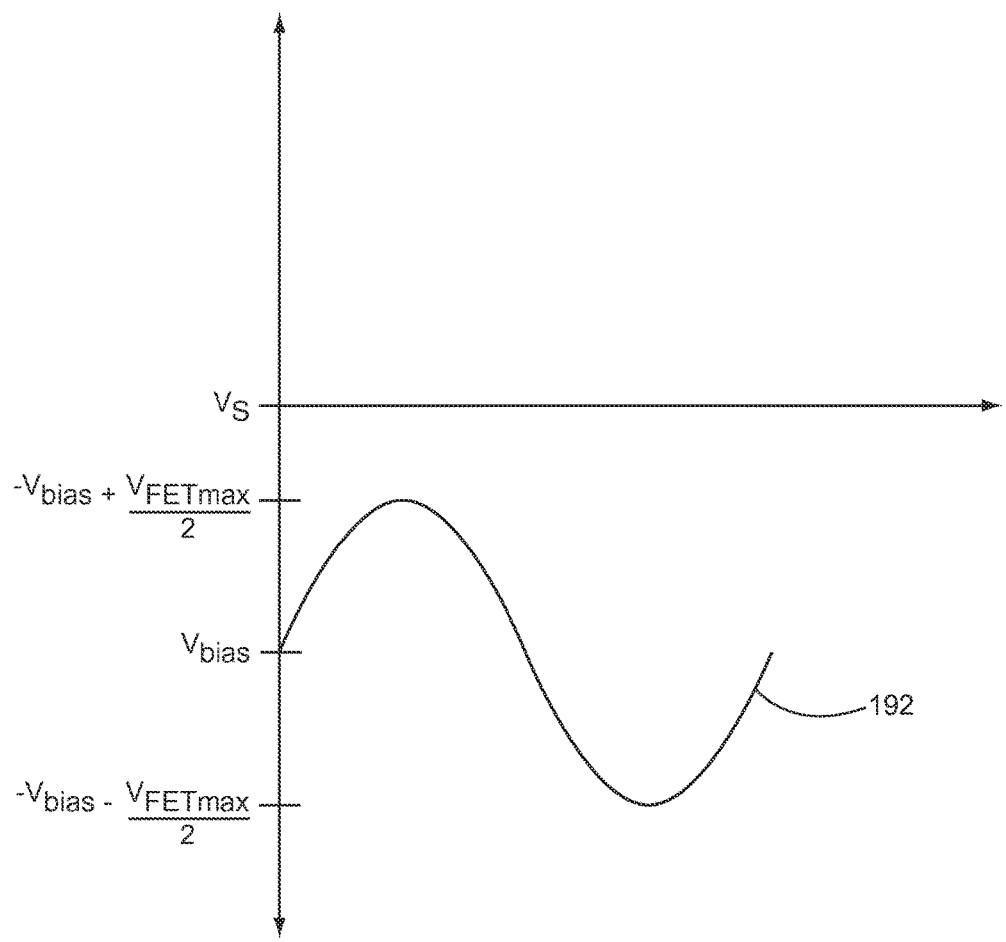
FIG. 9 illustrate a voltage of each of the gate contacts relative to the source contacts of the middle FET devices when the FET device stack in FIG. 6 is in the open state.

Referring now to FIG. 6 and FIG. 9, FIG. 9 illustrates a voltage signal 192 at the gate contact, G, of each of the middle FET devices ($Q_2$-$Q_{M-1}$), relative to their source contact, S, during the open state of the FET device stack 170. Note that the gate contact, G, of each of the middle FET devices ($Q_2$-$Q_{M-1}$) appears negatively biased at, -$V_{bias}$, since the drain and source contacts, D, S, of each of the middle FET devices ($Q_2$-$Q_{M-1}$) are positively biased by the first voltage, +$V_{bias}$. For each of the middle FET devices ($Q_2$-$Q_{M-1}$) shown in FIG. 6, half of the voltage drop for the voltage signal 182 (shown in FIG. 8) occurs between the drain contact, D, and the gate contact, G, and the other half occurs between the gate contact, G, and the source contact, S. Consequently, the voltage signal 192 is centered at the negative bias, -$V_{bias}$, and has a maximum positive-cycle peak voltage, $$-V_{bias} + \frac{V_{FETmax}}{2},$$

and a maximum negative-cycle peak voltage, $$-V_{bias} - \frac{V_{FETmax}}{2}.$$

To maintain the middle FET devices ($Q_2$-$Q_{M-1}$) in the open state, the voltage signal 192 must not be greater than the reverse-biased pinch-off voltage, -$V_p$, during the positive cycle. The upper limit of the maximum peak voltage, $$-V_{bias} + \frac{V_{FETmax}}{2},$$

can thus be expressed as:

$$-V_{bias} + \frac{V_{FETmax}}{2} = (-V_p)$$

Since the voltage between the drain contacts, D, and the gate contacts, G, at cannot exceed the negative breakdown voltage, -$V_{Break}$, the lower limit of the minimum peak voltage $$-V_{bias} - \frac{V_{FETmax}}{2},$$

can be expressed as:

$$-V_{bias} - \frac{V_{FETmax}}{2} = -V_{Break}$$

From these two equations, the highest allowable value of the maximum peak voltage, $V_{FETmax}$, can be solved as $$V_{FETmax} = |V_{Break}| + (-V_p)$$

Also, from the two equations, we can also solve for the magnitude of the first voltage, $V_{bias}$, relative to ground which may be expressed as:

$$V_{bias} = \frac{|V_{Break}| + (-V_p)}{2}$$

If the maximum peak voltage, $V_{max}$, of the time-variant input signal 42 is reaches a maximum voltage, $V_{pk}$, then the number, M, of FET devices 168 needed to safely utilize the FET device stack 170 may be expressed as:

$$M \geq \frac{V_{pk}}{(|V_{Break}| + (-V_p))} + 2$$

The number M of FET devices 168 thus may determine the maximum rated voltage that can be handled by the FET device stack 170.

It should be noted that the equations shown above are estimations for the described values of the stacked FET switch 166 illustrated in FIG. 6. In actual practice, these values may vary from the aforementioned equations as a result of non-ideal behavior of the electronic components in the stacked FET switch 166. In other embodiments, the relationships described by the aforementioned equations may be different depending on the particular circuit topology and electronic components utilized for the stacked FET switch 166. For example, the aforementioned equations have been determined under the assumption that the FET devices 168 are depletion mode type FET devices 168. However, enhancement mode type FET devices 168 may also be utilized in the stacked FET switch 166. In addition, it was assumed that the FET devices 168 have congruent drains and sources and in the alternative, one or more of the FET devices 168 may not have congruent drains and sources. Also, as discussed above, alternative embodiments may not completely decouple the first FET device ($Q_1$) and the last FET device ($Q_M$) and thus, for example, the first FET device ($Q_1$) and the last FET device ($Q_M$) may contribute half of their load handling capabilities to the FET device stack 170. One of ordinary skill in the art would be able to reformulate the relationships expressed by the aforementioned equations in accordance with non-ideal circuit behavior and the particular circuit topology and electronic components utilized to form the stacked FET switch 166 in light of this disclosure.

Those skilled in the art will recognize improvements and modifications to the preferred embodiments of the present disclosure. All such improvements and modifications are considered within the scope of the concepts disclosed herein and the claims that follow.

What is claimed is:

1. A stacked field effect transistor (FET) switch for a time-variant radio frequency (RF) signal, the stacked FET switch comprising:
   an input terminal for receiving the time-variant RF signal;
   an output terminal;
   a FET device stack operable in an open state and in a closed state, the FET device stack comprising a plurality of FET devices coupled in series to form the FET device stack, wherein the FET device stack is connected between the input terminal and the output terminal, the plurality of FET devices including at least a first FET device, one or more middle FET devices, and a last FET device, each of the plurality of FET devices having a gate contact, a drain contact, and a source contact, wherein the drain contact of the first FET device is connected directly to the input terminal at a first end of the FET device stack, and the source contact of the last FET device is connected to the output terminal at a second end of the FET device stack, and wherein the one or more middle FET devices are coupled in the FET device stack between the first FET device and the last FET device;
   a first decoupling path configured to pass the time-variant RF signal during the open state of the FET device stack, wherein the first decoupling path comprises a first bypass transistor having a first control terminal coupled to a control circuit that is configured to turn on the first bypass transistor when the FET device stack is in the open state and turn off the first bypass transistor when the FET device stack is in the closed state, the first bypass transistor being connected directly to the input terminal such that the time-variant RF signal bypasses the FET device stack from the input terminal to the gate contact of the first FET device during the open state;
   a second decoupling path configured to pass the time-variant RF signal during the open state of the FET device stack, wherein the second decoupling path comprises a second bypass transistor having a second control terminal coupled to the control circuit that is further configured to turn on the second bypass transistor when the FET device stack is in the open state and turn off the second bypass transistor when the FET device stack is in the closed state, the second bypass transistor being connected directly to the output terminal such that the time-variant RF signal bypasses the FET device stack from the gate contact of the last FET device to the output terminal during the open state; and
   a first resistive circuit comprising a first end coupled to the input terminal and a second end coupled to the output terminal, wherein the first resistive circuit comprises:
     a first capacitive element coupled to the first end or the second end, and
     a first resistor coupled between the first capacitive element and a first source/drain contact between a first pair of FET devices in the FET device stack.

2. The stacked FET switch of claim 1, wherein:
   the first decoupling path is connected to the FET device stack such that the time-variant RF signal bypasses the FET device stack from the drain contact of the first FET device to the gate contact of the first FET device during the open state; and
   the first decoupling path is connected between the drain contact of the first FET device and the gate contact of the first FET device.

3. The stacked FET switch of claim 1, wherein the second decoupling path is connected between either the drain contact of the last FET device or the gate contact of the last FET device and the source contact of the last FET device.

4. The stacked FET switch of claim 1, wherein the second decoupling path is connected between either the drain contact of the last FET device or the gate contact of the last FET device and a ground node.

5. The stacked FET switch of claim 1, wherein the second decoupling path is connected to the FET device stack such that the time-variant RF signal bypasses the FET device stack from the gate contact of the last FET device to the source contact of the last FET device during the open state, and wherein the stacked FET switch further comprises:
   a third decoupling path configured to pass the time-variant RF signal during the open state of the FET device stack, the third decoupling path being connected to the FET device stack such that the time-variant RF signal bypasses the FET device stack from the drain contact of the last FET device to the source contact of the last FET device during the open state.

6. The stacked FET switch of claim 1, wherein the first decoupling path is connected directly to the input terminal and either the gate contact of the first FET device or the source contact of the first FET device.

7. The stacked FET switch of claim 1, wherein the second decoupling path is connected between either the drain contact of the last FET device or the gate contact of the first FET device and the output terminal.

8. The stacked FET switch of claim 1, further comprising:
   a second resistive circuit coupled to each of the gate contacts of the plurality of FET devices, the second resistive circuit providing a high resistance at each of the gate contacts of the plurality of FET devices so as to render parasitic capacitances between the gate contact and the drain and source contacts of each of the plurality of FET devices negligible.

9. The stacked FET switch of claim 8, further comprising a control circuit operably associated with the FET device stack, the control circuit being configured to:
   bias the gate contacts of each of the plurality of FET devices at a first voltage such that the FET device stack operates in the closed state, the first voltage being positive relative to a reference voltage; and
   bias the gate contact of each of the plurality of FET devices at a second voltage and bias the drain contacts and source contacts of each of the one or more middle FET devices at the first voltage, such that the FET device stack operates in the open state, the second voltage being less than the first voltage and non-negative relative to the reference voltage.

10. The stacked FET switch of claim 9, wherein the control circuit is further configured to bias the drain contacts and source contacts of each of the one or more middle FET devices at the second voltage during the closed state.

11. The stacked FET switch of claim 9, wherein the first decoupling path and the second decoupling path are configured to block DC bias voltages.

12. The stacked FET switch of claim 9, wherein the drain contacts and source contacts of each of the plurality of FET devices are coupled so that biasing the drain contact and the source contact of each of the one or more middle FET devices biases the source contact of the first FET device.

13. The stacked FET switch of claim 9, wherein the drain contacts and source contacts of each of the plurality of FET devices are operably associated with one another such that biasing the drain contact and the source contact of each of the one or more middle FET devices biases the drain contact of the last FET device.

14. A stacked field effect transistor (FET) switch for a time-variant RF signal, the stacked FET switch comprising:
   an input terminal for receiving the time-variant RF signal;
   an output terminal;
   a FET device stack operable in an open state and in a closed state, the FET device stack comprising a plurality of FET devices coupled in series to form the FET device stack, the FET device stack having a first end and a second end, the plurality of FET devices each having a gate contact, a drain contact, and a source contact, and a body contact;
   a first decoupling path configured to pass the time-variant RF signal during the open state of the FET device stack, wherein the first decoupling path comprises a first bypass transistor having a first control terminal coupled to a control circuit that is configured to turn on the first bypass transistor when the FET device stack is in the open state and turn off the first bypass transistor when the FET device stack is in the closed state, the first bypass transistor being connected directly between the input terminal and the gate contact of one of the plurality of FET devices, the body contact of the one of the plurality of FET devices being directly connected to the input terminal;
   a second decoupling path configured to pass the time-variant RF signal during the open state of the FET device stack, wherein the second decoupling path comprises a second bypass transistor having a second control terminal coupled to the control circuit that is further configured to turn on the second bypass transistor when the FET device stack is in the open state and turn off the second bypass transistor when the FET device stack is in the closed state, the second bypass transistor being connected directly between the output terminal and the gate contact of another one of the plurality of FET devices, the body contact of the another one of the plurality of FET devices being directly connected to the output terminal; and
   a resistive circuit comprising a first end coupled to the input terminal and a second end coupled to the output terminal, wherein the resistive circuit comprises:
      a first capacitive element coupled to the first end,
      a first resistor coupled between the first capacitive element and a first source/drain contact between a first pair of FET devices in the FET device stack,
      a second capacitive element coupled to the second end, and
      a second resistor coupled between the second capacitive element and a second source/drain contact between a second pair of FET devices in the FET device stack, wherein:
         the first resistor and the second resistor are a same resistor or different resistors,
         the first pair of FET devices and the second pair of FET devices are a same pair of FET devices or different pairs of FET devices, and
         the first source/drain contact and the second source/drain contact are a same source/drain contact or different source/drain contacts.

15. The stacked FET switch of claim 1, wherein the first capacitive element is coupled to the first end and the resistive circuit further comprises:
   a second capacitive element coupled to the second end; and
   a second resistor coupled between the second capacitive element and a second source/drain contact between a second pair of FET devices in the FET device stack.

16. The stacked FET switch of claim 15, wherein:
the first resistor and the second resistor are a same resistor; and
the first pair of FET devices and the second pair of FET devices are a same pair of FET devices such that the first source/drain contact and the second source/drain contact are a same source/drain contact.

17. The stacked FET switch of claim 15, wherein each of the first capacitive device and the second capacitive device blocks biasing by a control voltage.

* * * * *